(12) United States Patent
Shin et al.

(10) Patent No.: US 11,615,833 B2
(45) Date of Patent: Mar. 28, 2023

(54) MULTI-LEVEL SIGNAL RECEIVERS AND MEMORY SYSTEMS INCLUDING THE SAME

(71) Applicant: SAMSUNG ELECTRONICS CO., LTD., Suwon-si (KR)

(72) Inventors: Kwangseob Shin, Anyang-si (KR); Jindo Byun, Suwon-si (KR); Younghoon Son, Yongin-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/223,458

(22) Filed: Apr. 6, 2021

(65) Prior Publication Data

US 2022/0068356 A1 Mar. 3, 2022

(30) Foreign Application Priority Data

Aug. 31, 2020 (KR) .................. 10-2020-0110031

(51) Int. Cl.
*G11C 16/26* (2006.01)
*G11C 11/4091* (2006.01)
*G11C 11/4074* (2006.01)
*G11C 11/4076* (2006.01)
*G11C 11/408* (2006.01)
*G11C 11/4099* (2006.01)

(52) U.S. Cl.
CPC ...... *G11C 11/4091* (2013.01); *G11C 11/4074* (2013.01); *G11C 11/4076* (2013.01); *G11C 11/4087* (2013.01); *G11C 11/4099* (2013.01)

(58) Field of Classification Search
CPC .................................................. G11C 11/4091
See application file for complete search history.

(56) References Cited

U.S. PATENT DOCUMENTS

| | | |
|---|---|---|
| 6,442,089 B1 | 8/2002 | Fletcher et al. |
| 7,124,221 B1 | 10/2006 | Zerbe et al. |
| 7,327,184 B2 | 2/2008 | Sung et al. |
| 7,626,442 B2 | 12/2009 | Zerbe et al. |
| 7,808,841 B2 | 10/2010 | Choi et al. |
| 8,045,647 B2 | 10/2011 | Oh et al. |
| 8,750,406 B2 | 6/2014 | Pan et al. |

(Continued)

FOREIGN PATENT DOCUMENTS

WO 0150228 A2 7/2001

OTHER PUBLICATIONS

Communication dated Nov. 23, 2021, issued by the European Patent Office in counterpart European Application No. 21176734.8.

*Primary Examiner* — Min Huang
(74) *Attorney, Agent, or Firm* — Sughrue Mion, PLLC

(57) ABSTRACT

A multi-level signal receiver includes a data sampler circuit and a reference voltage generator circuit. The data sampler includes (M−1) sense amplifiers which compare a multi-level signal having one of M voltage levels different from each other with (M−1) reference voltages. The data sampler generates a target data signal including N bits, M is an integer greater than two and N is an integer greater than one. The reference voltage generator generates the (M−1) reference voltages, At least two sense amplifiers of the (M−1) sense amplifiers have different sensing characteristics.

20 Claims, 23 Drawing Sheets

(56) References Cited

U.S. PATENT DOCUMENTS

| | | |
|---|---|---|
| 9,544,169 B2 | 1/2017 | Zerbe et al. |
| 2003/0011426 A1 | 1/2003 | Casper |
| 2003/0080795 A1* | 5/2003 | Okamoto ................ G11C 7/22 |
| | | 327/333 |
| 2018/0278461 A1* | 9/2018 | Hollis ................ G11C 11/5642 |
| 2019/0114097 A1* | 4/2019 | Tran ................ G11C 16/0408 |
| 2019/0250973 A1 | 8/2019 | Wang et al. |
| 2019/0332279 A1 | 10/2019 | Hollis et al. |
| 2021/0390987 A1* | 12/2021 | Dong ................ G11C 7/1012 |

* cited by examiner

MULTI-LEVEL SIGNAL RECEIVERS AND MEMORY SYSTEMS INCLUDING THE SAME

CROSS-REFERENCE TO RELATED APPLICATION

This application is based on and claims priority under 35 USC § 119 to Korean Patent Application No. 10-2020-0110031, filed on Aug. 31, 2020 in the Korean Intellectual Property Office (KIPO), the content of which are herein incorporated by reference in their entirety.

BACKGROUND

1. Technical Field

Example embodiments relate generally to semiconductor integrated circuits, and more particularly to multi-level signal receivers and memory systems including the same.

2. Description of the Related Art

Semiconductor memory devices can generally be divided into two categories depending upon whether or not they retain stored data when disconnected from a power supply. The two categories of memory devices include volatile memory devices, which lose stored data when disconnected from power, and nonvolatile memory devices, which retain stored data when disconnected from power. Volatile memory devices may perform read and write operations at a high speed, while content stored therein may be lost at power-off. Nonvolatile memory devices may retain content stored therein even at power-off, and as such, they may be used to store data that must be retained regardless of whether the memory devices are powered or not.

Recently, as the performance of the semiconductor memory device is improved, a high communication speed (or interface speed) is required between a memory controller and the semiconductor memory device. Thus, a multi-level signaling in which a plurality of bits are transmitted during one unit interval (UI) has been researched.

SUMMARY

According to an aspect of the disclosure, there is provided a multi-level signal receiver including: a data sampler circuit including (M−1) sense amplifiers configured to compare a multi-level signal with (M−1) reference voltages, the data sampler configured to generate a data signal including N bits, the multi-level signal having one of M voltage levels different from each other, M being an integer greater than two and N being an integer greater than one; and a reference voltage generator circuit configured to generate the (M−1) reference voltages, wherein at least two sense amplifiers of the (M−1) sense amplifiers have different sensing characteristics.

According to another aspect of the disclosure, there is provided a memory system including: a memory controller configured to generate a multi-level signal based on input data, the multi-level signal having one of M voltage levels different from each other, M being an integer greater than two; and a memory device configured to receive the multi-level signal from the memory controller and compare the multi-level signal with (M−1) reference voltages to generate a data signal including N bits, N being an integer greater than one, wherein the memory device includes: a data sampler circuit including (M−1) sense amplifiers configured to compare the multi-level signal with the (M−1) reference voltages to generate the data signal; and a reference voltage generator circuit configured to generate the (M−1) reference voltages, and wherein at least two sense amplifiers of the (M−1) sense amplifiers have different sensing characteristic.

According to another aspect of the disclosure, there is provided a multi-level signal receiver including: a data sampler circuit including a first sense amplifier configured to compare a multi-level signal with a first reference voltage, a second sense amplifier configured to compare the multi-level signal with a second reference voltage, and a third sense amplifier configured to compare the multi-level signal with a third reference voltage, the data sampler circuit configured to generate a data signal including two bits, and the multi-level signal having one of a first voltage level, a second voltage level, a third voltage level and a fourth voltage level, the first through fourth voltage levels being different from each other; and a reference voltage generator circuit configured to generate the first through third reference voltages, wherein: the first sense amplifier is configured to compare the multi-level signal with the first reference voltage to output a first comparison signal based on a clock signal; the second sense amplifier is configured to compare the multi-level signal with the second reference voltage to output a second comparison signal based on the clock signal; the third sense amplifier is configured to compare the multi-level signal with the third reference voltage to output a second comparison signal based on the clock signal; at least two sense amplifiers of the first through third sense amplifiers have different sensing characteristics; and a level of the second reference voltage is greater than a level of the first reference voltage and a level of the third reference voltage is greater the level of the second reference voltage.

According to another aspect of the disclosure, there is provided an apparatus including: (M−1) sense amplifiers configured to compare a multi-level signal with (M−1) reference voltages and output one or more sense signals; and an output decoder configured to generate an output data signal based on the one or more sense signals, the output data signal including N bits, wherein the multi-level signal having one of M voltage levels different from each other, M being an integer greater than two and N being an integer greater than one, and wherein the (M−1) sense amplifiers comprises: a first sense amplifier having a first voltage threshold; and a second sense amplifier having a second voltage threshold different from the first voltage threshold.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
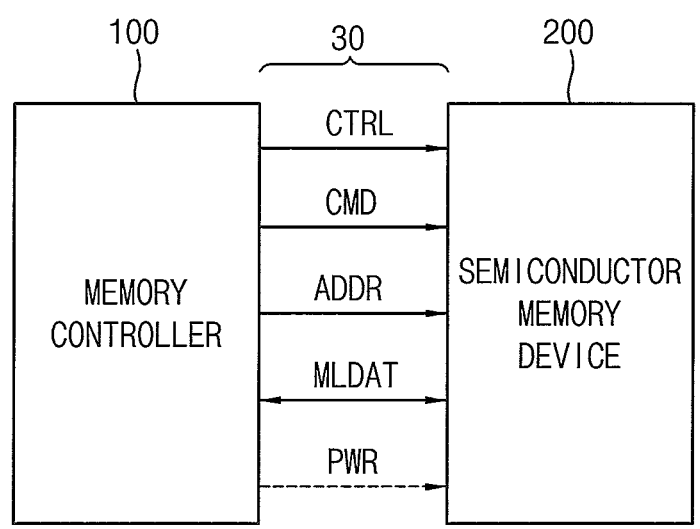
FIG. 1 is a block diagram illustrating a memory system according to one or more example embodiments.

Various example embodiments will be described more fully with reference to the accompanying drawings, in which embodiments are shown. The disclosure may, however, be embodied in many different forms and should not be construed as limited to the example embodiments set forth herein. Like reference numerals refer to like elements throughout this application.

FIG. 1 is a block diagram illustrating a memory system according to one or more example embodiments.

Referring to FIG. 1, a memory system 10 includes a memory controller 100 and a semiconductor memory device 200. The memory system 10 may further include a plurality of signal lines 30 that electrically connect the memory controller 100 with the semiconductor memory device 200.

The semiconductor memory device 200 is controlled by the memory controller 100. For example, based on requests from a host, the memory controller 100 may store (e.g., write or program) data into the semiconductor memory device 200, or may retrieve (e.g., read or sense) data from the semiconductor memory device 200. For example, the memory controller 100 may write or program data or information into the semiconductor memory device 200, or may read or sense data or information from the semiconductor memory device 200

The plurality of signal lines 30 may include control lines, command lines, address lines, data input/output (I/O) lines and power lines. The memory controller 100 may transmit a command CMD, an address ADDR and a control signal CTRL to the memory device 200 via the command lines, the address lines and the control lines, may exchange a data signal MLDAT with the semiconductor memory device 200 via the data I/O lines, and may transmit a power supply voltage PWR to the semiconductor memory device 200 via the power lines.

For example, the data signal MLDAT may be the multi-level signal that is generated and transmitted according to one or more example embodiments. According to an example embodiment, the plurality of signal lines 30 may further include data strobe signal (DQS) lines for transmitting a DQS signal.

In some example embodiments, at least a part or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 2:
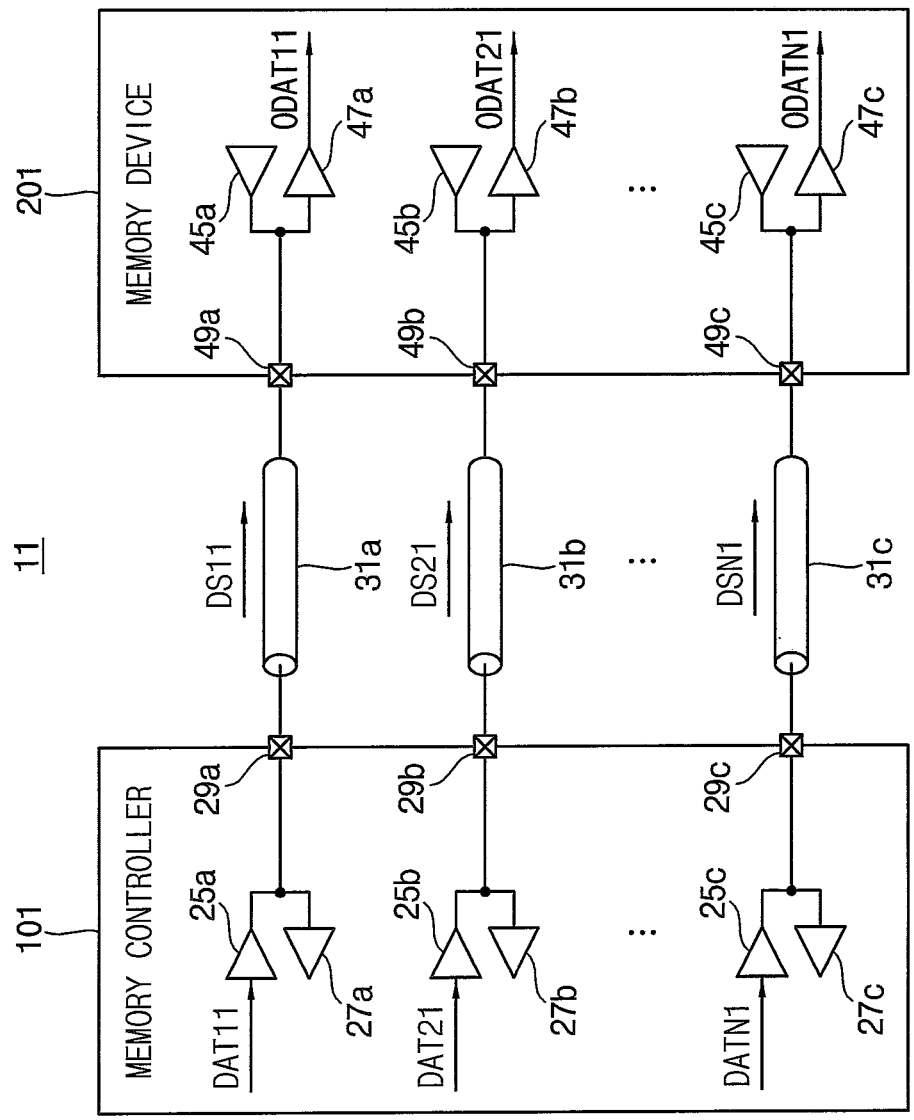
FIGS. 2 and 3 are block diagrams illustrating an example of a memory system of FIG. 1.
Figure 3:
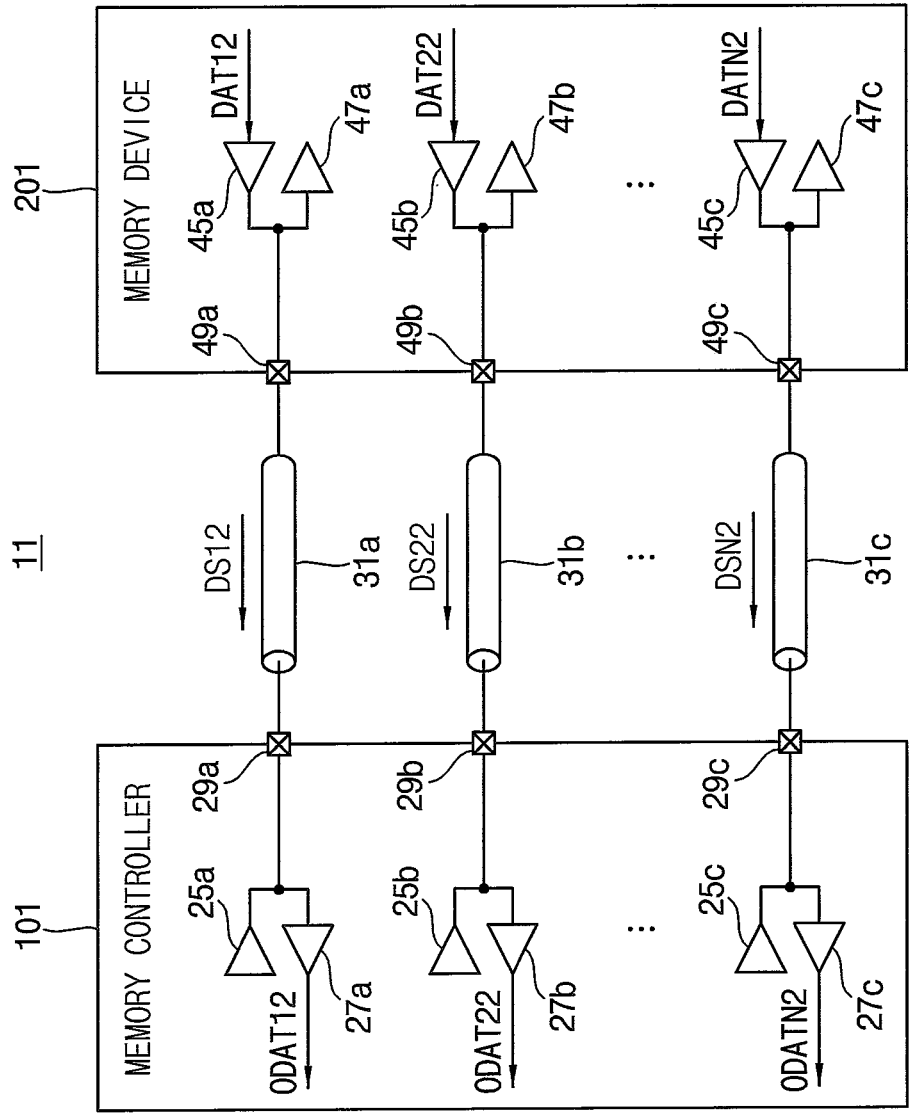

FIGS. 2 and 3 are block diagrams illustrating an example of a memory system of FIG. 1.

Referring to FIGS. 2 and 3, a memory system 11 includes a memory controller 101, a semiconductor memory device 201 and a plurality of channels 31a, 31b and 31c.

The memory controller 101 may include a plurality of transmitters 25a, 25b and 25c, a plurality of receivers 27a, 27b and 27c, and a plurality of data I/O pads 29a, 29b and 29c. The semiconductor memory device 201 may include a plurality of transmitters 45a, 45b and 45c, a plurality of receivers 47a, 47b and 47c, and a plurality of data I/O pads 49a, 49b and 49c. Although FIGS. 2-3 illustrate three sets of channels, receivers, transmitters and data I/O pads, the disclosure is not limited thereto, and numbers channels, receivers, transmitters and data I/O pads may be provided according to other example embodiments.

Each of the plurality of transmitters 25a, 25b, 25c, 45a, 45b and 45c may generate a multi-level signal. For example, each of the plurality of transmitters 25a, 25b, 25c, 45a, 45b and 45c may perform a method of generating multi-level signal. Each of the plurality of receivers 27a, 27b, 27c, 47a, 47b and 47c may receive the multi-level signal. The plurality of transmitters 25a, 25b, 25c, 45a, 45b and 45c and the plurality of receivers 27a, 27b, 27c, 47a, 47b and 47c may transmit and receive multi-level signal through the plurality of channels 31a, 31b and 31c.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect the memory controller 101 with the semiconductor memory device 201.

Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. The multi-level signal may be transmitted through each of the plurality of channels 31a, 31b and 31c.

FIG. 2 illustrates an operation of transferring data from the memory controller 101 to the semiconductor memory device 201. For example, the transmitter 25a may generate an output data signal DS11, which is the multi-level signal, based on input data DAT11. The output data signal DS11 may be transmitted from the memory controller 21 to the memory device 41 through the channel 31a, and the receiver 47a may receive the output data signal DS11 to obtain data ODAT11 corresponding to the input data DAT11.

Similarly, the transmitter 25b may generate an output data signal DS21, which is the multi-level signal, based on input data DAT21. The output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1, which is the multi-level signal, based on input data DATN1. The output data signal DSN1 may be transmitted to the semiconductor memory device 201 through the channel 31c, and the receiver 47c may receive the output data signal DSN1 to obtain data ODATN1 corresponding to the input data DATN1. For example, the input data DAT11, DAT21 and DATN1 may be write data to be written into the semiconductor memory device 201.

FIG. 3 illustrates an operation of transferring data from the semiconductor memory device 201 to the memory controller 101. For example, the transmitter 45a may generate an output data signal DS12, which is the multi-level signal, based on input data DAT12. The output data signal DS12 may be transmitted from the memory device 201 to the memory controller 101 through the channel 31a, and the receiver 27a may receive the output data signal DS12 to obtain data ODAT12 corresponding to the input data DAT12.

Similarly, the transmitter 45b may generate an output data signal DS22, which is the multi-level signal, based on input data DAT22. The output data signal DS22 may be transmitted to the memory controller 101 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2. The output data signal DSN2 may be transmitted to the memory controller 101 through the channel 31c, and the receiver 27c may receive the output data signal DSN2 to obtain data ODATN2 corresponding to the input data DATN2. For example, the input data DAT12, DAT22 and DATN2 may be read data retrieved from the semiconductor memory device 201.

Figure 4:
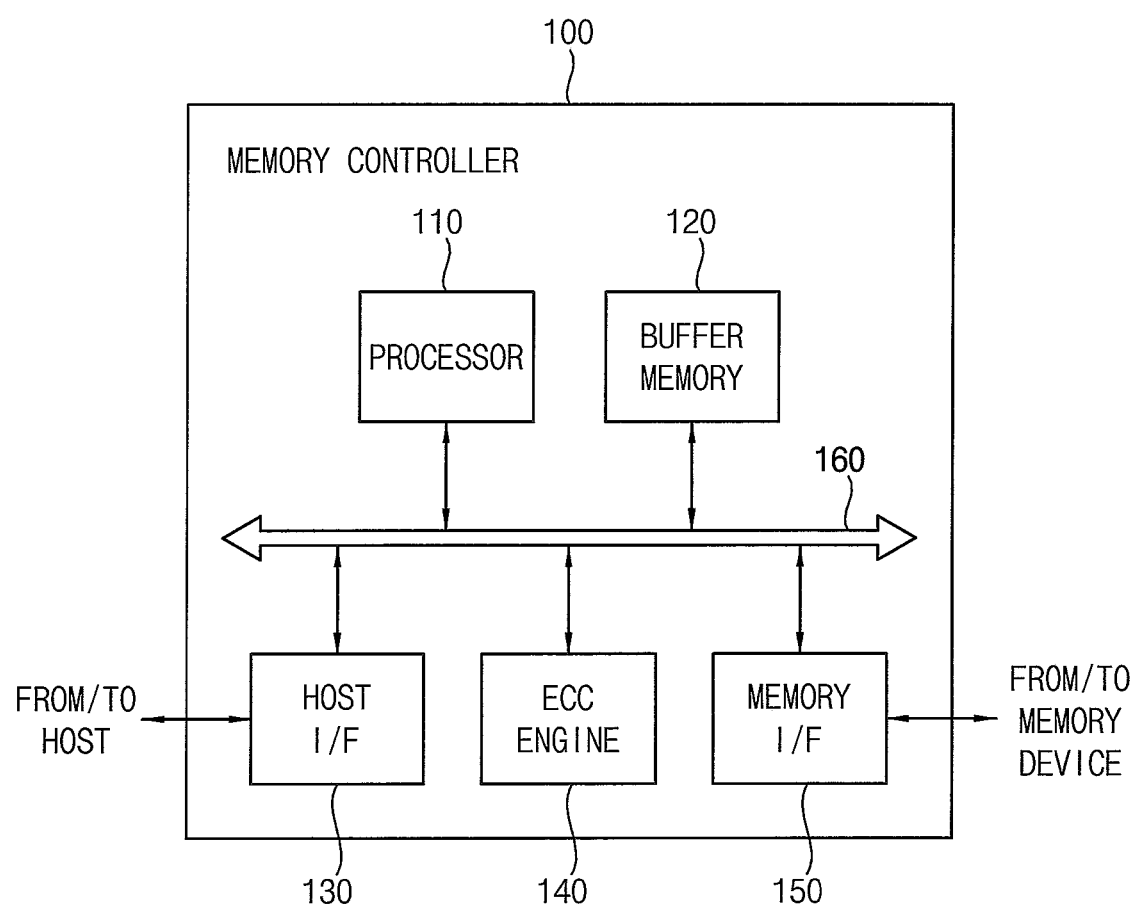
FIG. 4 is a block diagram illustrating an example of a memory controller included in a memory system according to one or more example embodiments.

FIG. 4 is a block diagram illustrating an example of a memory controller included in a memory system according to one or more example embodiments.

Referring to FIG. 4, a memory controller 100 may include at least one processor 110, a buffer memory 120, a host interface (I/F) 130, an error correction code (ECC) engine 140 and a memory interface (I/F) 150.

The processor 110 may control an operation of the memory controller 100 in response to a command and/or request received via the host interface 130 from an external host. For example, the processor 110 may control respective components by employing firmware for operating a memory device (e.g., the semiconductor memory device 200 in FIG. 1).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100.

The ECC engine 140 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the semiconductor memory device 200. The memory interface 150 may transmit a command and an address to the semiconductor memory device 200, and may transmit data to the semiconductor memory device 200 or receive data read from the semiconductor memory device 200. According to an example embodiment, a transmitter that generates the multi-level signal according to one or more example embodiments and a receiver that receives the multi-level signal may be included in the memory interface 150. According to an example embodiment, the transmitter may be the transmitter 25a illustrated in FIG. 2 and the receiver may be the receiver 27a illustrated in FIG. 2.

Figure 5A:
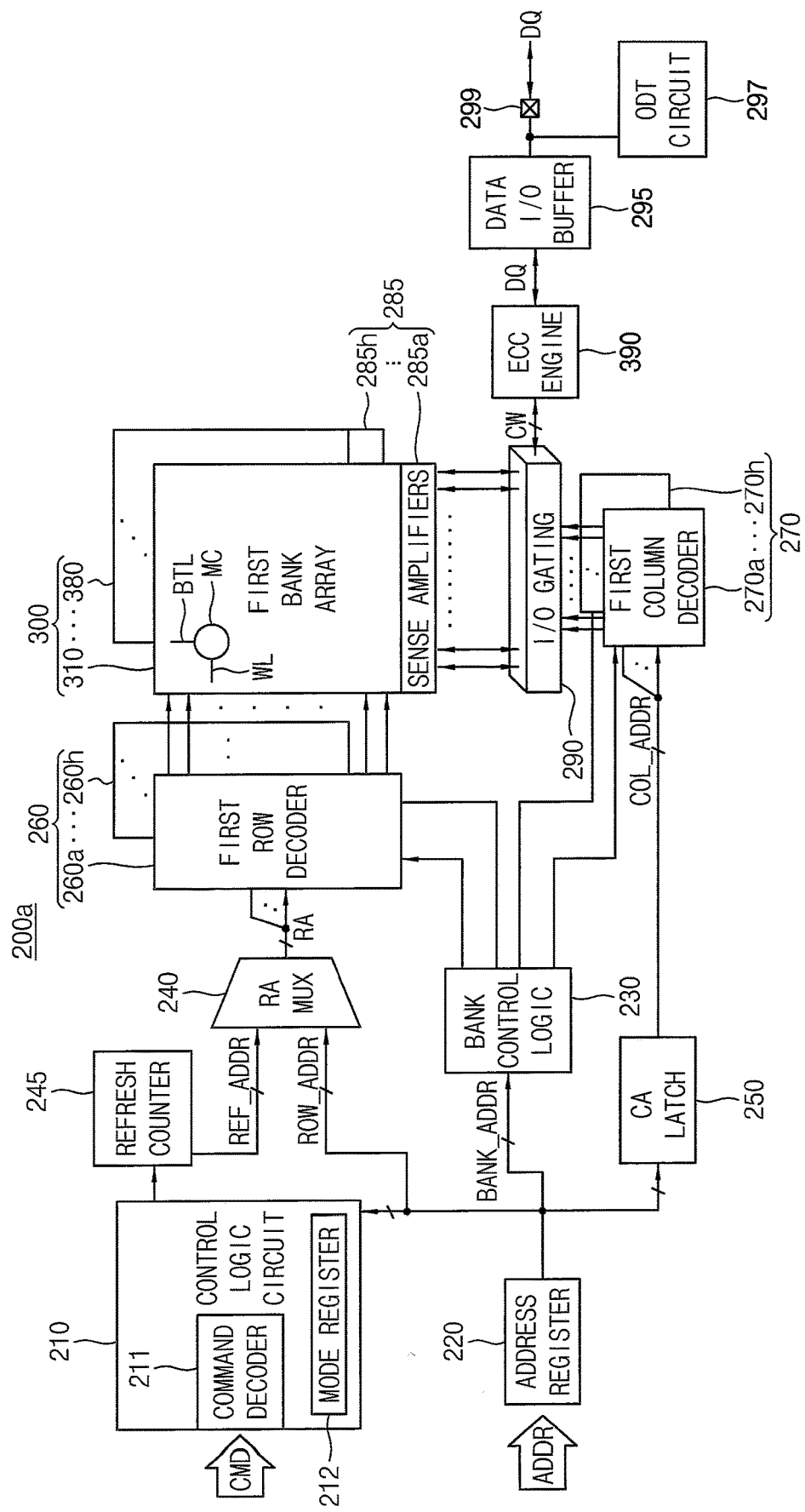
FIG. 5A is a block diagram illustrating an example of the semiconductor memory device included in the memory system of FIG. 1 according to one or more example embodiments.

FIG. 5A is a block diagram illustrating an example of the semiconductor memory device included in the memory system of FIG. 1 according to one or more example embodiments.

Referring to FIG. 5A, the semiconductor memory device 200a includes the control logic circuit 210, an address register 220, a bank control logic 230, a refresh counter 245, a row address (RA) multiplexer 240, a column address (CA) latch 250, a row decoder 260, a column decoder 270, a memory cell array 300, a sense amplifier unit 285, an I/O gating circuit 290, an error correction code (ECC) engine 390, an on-die termination (ODT) circuit 297, a data I/O buffer 295 and a data I/O pad 299.

According to one or more example embodiment, the semiconductor memory device 200a may be a volatile memory device and may include a dynamic random access memory (DRAM) device.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The refresh counter 245 may sequentially output the refresh row address REF_ADDR under control of the control logic circuit 210.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address.

The column address latch 250 receives the column address COL_ADDR from the address register 220, and temporarily stores the received column address COL_ADDR. In some embodiments, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h activates a sense amplifier corresponding to the bank address BANK_ADDR and the column address COL_ADDR through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

Codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 390.

The data DQ to be written in one bank array of the first through eighth bank arrays 310~380 may be provided to the data I/O buffer 295 from the memory controller 100, may be provided to the ECC engine 390 from the data I/O buffer 295, the ECC engine 390 may perform an ECC encoding on the data DQ to generate parity bits, the ECC engine 390 may provide the data DQ and the parity bits to the I/O gating circuit 290 and the I/O gating circuit 290 may write the data DQ and the parity bits in a sub-page in one bank array through the write drivers.

The data I/O buffer 295 may provide the target data signal DQ 100 to the ECC engine 390 in a write operation of the semiconductor memory device 200a, and may provide the data signal DQ from the ECC engine 390 to the memory controller 100 in a read operation of the semiconductor memory device 200a. The data I/O buffer 295 may include a multi-level signal receiver according to example embodiments, may decode the multi-level data MLDAT into a target data signal and may provide the target data signal to the ECC engine 390 in a write operation.

The ECC engine 390 may perform an ECC encoding and an ECC decoding on the target data signal DQ according to a control of the control logic circuit 210.

The control logic circuit 210 may control operations of the semiconductor memory device 200a. For example, the control logic circuit 210 may generate control signals for the semiconductor memory device 200a in order to perform a write operation or a read operation. The control logic circuit 210 includes a command decoder 211 that decodes the command CMD received from the memory controller 100 and a mode register 212 that sets an operation mode of the semiconductor memory device 200a.

For example, the command decoder 211 may generate the control signals corresponding to the command CMD by decoding a write enable signal, a row address strobe signal, a column address strobe signal, a chip select signal, etc.

The ODT circuit 297 may be connected to a data I/O pad 299 and the data I/O buffer 295. When the ODT circuit 297 is enabled, the ODT circuit 297 may perform ODT operation. When the ODT operation is performed, signal integrity of transmitted/received signal may be enhance by preventing signal reflection due to impedance matching.

Although the memory device included in the memory system according to example embodiments is described based on a DRAM, the memory device according to example embodiments may be any volatile memory device, and/or any nonvolatile memory device, e.g., a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5B:
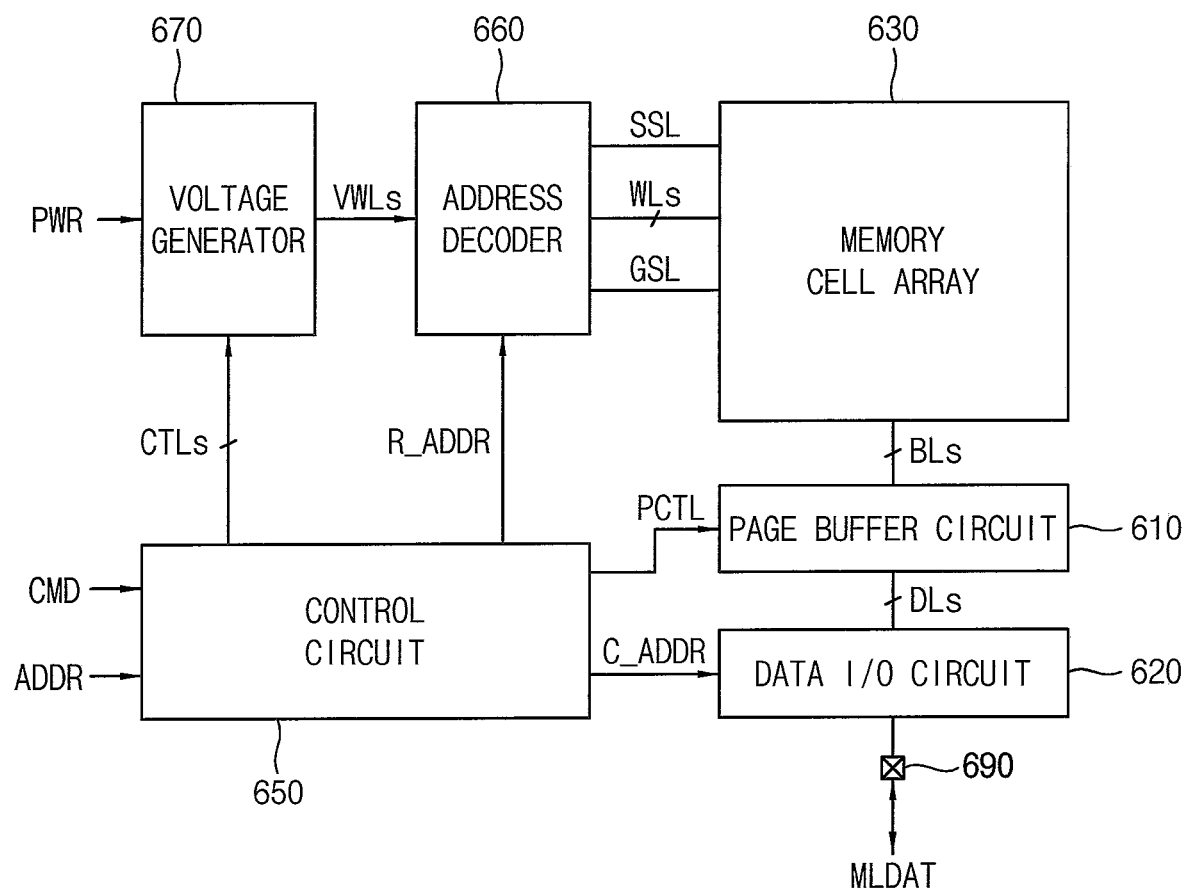
FIG. 5B is a block diagram illustrating another example of the semiconductor memory device included in the memory system of FIG. 1 according to one or more example embodiments.

FIG. 5B is a block diagram illustrating another example of the semiconductor memory device included in the memory system of FIG. 1 according to one or more example embodiments.

Referring to FIG. 5B, the semiconductor memory device 200b may be implemented with a nonvolatile memory device and may include a memory cell array 630, an address decoder 660, a page buffer circuit 610, a data input/output (I/O) circuit 620, a control circuit 650, a voltage generator 670, and a data I/O pad 690.

The memory cell array 630 is coupled to the address decoder 660 through a string selection line SSL, a plurality of word lines WLs, and a ground selection line GSL. In addition, the memory cell array 630 is coupled to the page buffer circuit 610 through a plurality of bit-lines BLs. The memory cell array 630 includes a plurality of nonvolatile memory cells coupled to the plurality of word lines WLs and the plurality of bit lines BLs.

The control circuit 650 may receive the command signal CMD and the address signal ADDR from the memory controller 100 and control an erase loop, a program loop, and a read operation of the nonvolatile memory device 200b based on the command signal CMD and the address signal ADDR. The erase loop may include erase operation and erase verify operation and the program loop may include program operation and program verify operation.

For example, the control circuit 650 may generate control signals CTLs, which are used for controlling the voltage generator 670, based on the command signal CMD, and generate a row address R_ADDR and a column address C_ADDR based on the address signal ADDR. The control circuit 650 may provide the row address R_ADDR to the address decoder 660 and provide the column address C_ADDR to the data input/output circuit 620.

For example, the address decoder 660 is coupled to the memory cell array 630 through the string selection line SSL, the plurality of word-lines WLs, and the ground selection line GSL. The address decoder 660 may determine one of the word-lines WLs as a first word-line (a selected word-line) and other word-lines of the word-lines WLs as unselected word-lines based on the row address R_ADDR from the control circuit 650 in a program operation and a read operation.

For example, the voltage generator 670 generates word-line voltages VWLs using the power PWR, which are used for the operation of the nonvolatile memory device 200b, based on the control signals CTLs. The word line voltages VWLs are applied to the plurality of word lines WLs through the address decoder 660.

For example, during the program operation, the voltage generator 370 may apply a program voltage to the selected word-line and may apply a program pass voltage to the unselected word-lines. In addition, during the program verification operation, the voltage generator 670 may apply a program verification voltage to the selected word-line and may apply a verification pass voltage to the unselected word-lines. In addition, during the read operation, the voltage generator 670 may apply a read voltage to the selected word-line and may apply a read pass voltage to the unselected word-lines.

For example, the page buffer circuit 610 is coupled to the memory cell array 630 through the plurality of bit-lines BLs. The page buffer circuit 610 may include a plurality of page buffers. In exemplary embodiments, one page buffer may be connected to one bit line. In other exemplary embodiments, one page buffer may be connected to two or more bit-lines.

The page buffer circuit 610 may temporarily store data to be programmed in a selected page or data read out from the selected page. The page buffer circuit 610 is controlled in response to a control signal PCTL received from the control circuit 650.

For example, the data input/output circuit 620 is coupled to the page buffer circuit 610 through data lines DLs and is connected to a data I/O pin 680. During the program operation, the data input/output circuit 620 may receive multi-level data MLDAT. The data input/output circuit 620 may include a multi-level signal receiver according to example embodiments, may decode the multi-level data MLDAT into a target data signal and may provide the target data signal to the page buffer circuit 610 based on the column address C_ADDR from the control circuit 650.

Hereinafter, example embodiments will be described in detail based on various examples of the multi-level signaling scheme and various examples of the transmitter according to the multi-level signaling scheme. For instance, the multi-level signaling scheme according to one or more example embodiments may be a Pulse-amplitude modulation (PAM) scheme.

Figure 6:
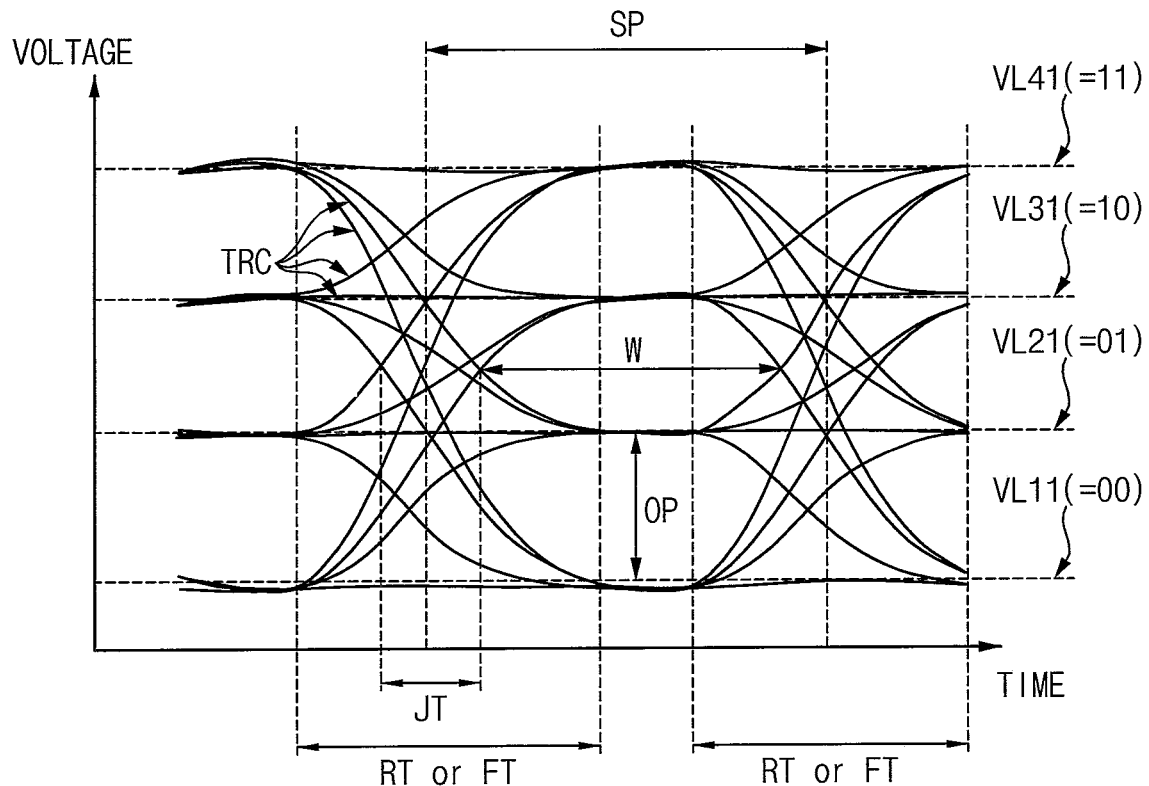
FIGS. 6 and 7 are diagrams for describing a data signal generated by a method of generating a multi-level signal according to one or more example embodiments.
Figure 7:
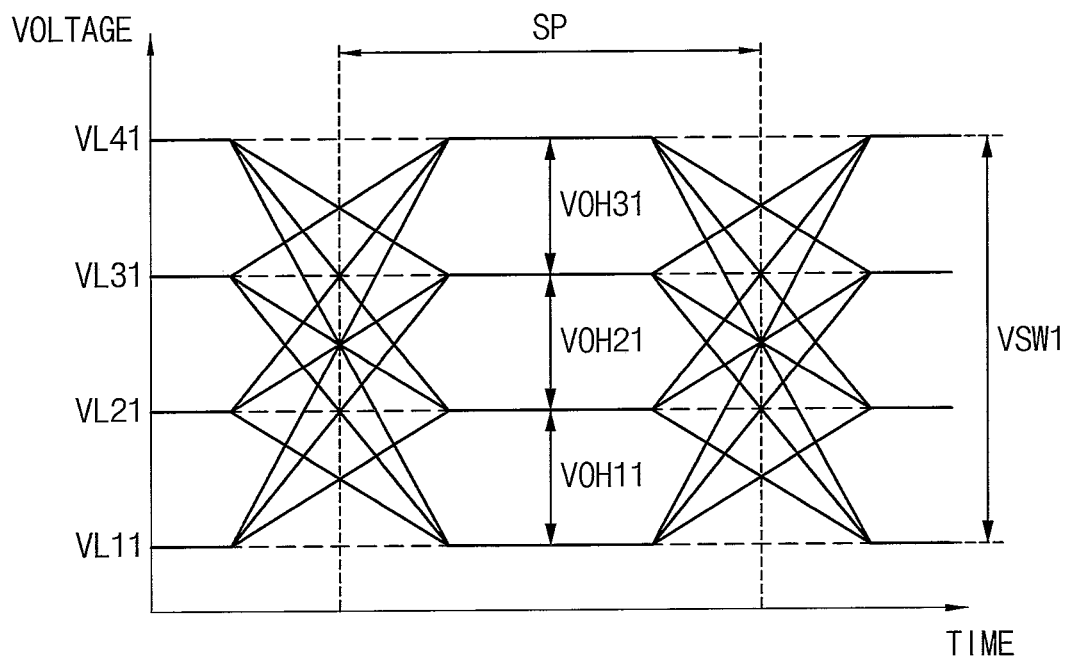

FIGS. 6 and 7 are diagrams for describing a data signal generated by a method of generating a multi-level signal according to one or more example embodiments.

FIG. 6 illustrates an ideal eye diagram of a data signal generated based on a 4-level scheme. For example, FIG. 6 illustrates an ideal eye diagram of a four-level pulse amplitude modulation (PAM-4) signal generated based on the fourth-level pulse amplitude modulation (PAM-4) signaling scheme. FIG. 7 is a simplified diagram illustrating the eye diagram of FIG. 6.

Referring to FIG. 6, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, crosstalk, electromagnetic interference (EMI), signal loss, signal-to-noise ratio (SNR), other characteristics, or combinations thereof.

For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31 and VL41. The eye opening OP may be related to a voltage margin for discriminating between different voltage levels VL11, VL21, VL31 and VL41 of the measured signal. The eye opening OP may correspond to the voltage interval described with reference to FIG. 1. For example, the eye diagram may be used to identify a rise time RT and/or a fall time FT for transitions from a first amplitude to a second amplitude. The rise time RT or the fall time FT may indicate a time required for transitioning from one voltage level to another voltage level, and may be related to or associated with a rising edge and a falling edge, respectively. The jitter JT may refer to a timing error which results from a misalignment of rise and fall times. The jitter JT may occur when the rising edge or the falling edge occurs at a time that is different from an ideal time defined by the data clock.

According to an example embodiment, FIG. 7 illustrates different first, second, third and fourth voltage levels VL11, VL21, VL31 and VL41 of the data signal that is the PAM-4 signal, different first, second and third voltage intervals VOH11, VOH21 and VOH31 of the data signal, and a voltage swing width VSW1 of the data signal.

The first voltage level VL11 that is the lowest voltage level may be lower than the second voltage level VL21, the second voltage level VL21 may be lower than the third voltage level VL31, and the third voltage level VL31 may be lower than the fourth voltage level VL41 that is the highest voltage level. In addition, the first voltage interval VOH11 may represent a difference between the first and second voltage levels VL11 and VL21, the second voltage interval VOH21 may represent a difference between the second and third voltage levels VL21 and VL31, the third voltage interval VOH31 may represent a difference between the third and fourth voltage levels VL31 and VL41, and the voltage swing width VSW1 may represent a difference between the first and fourth voltage levels VL11 and VL41.

Figure 8:
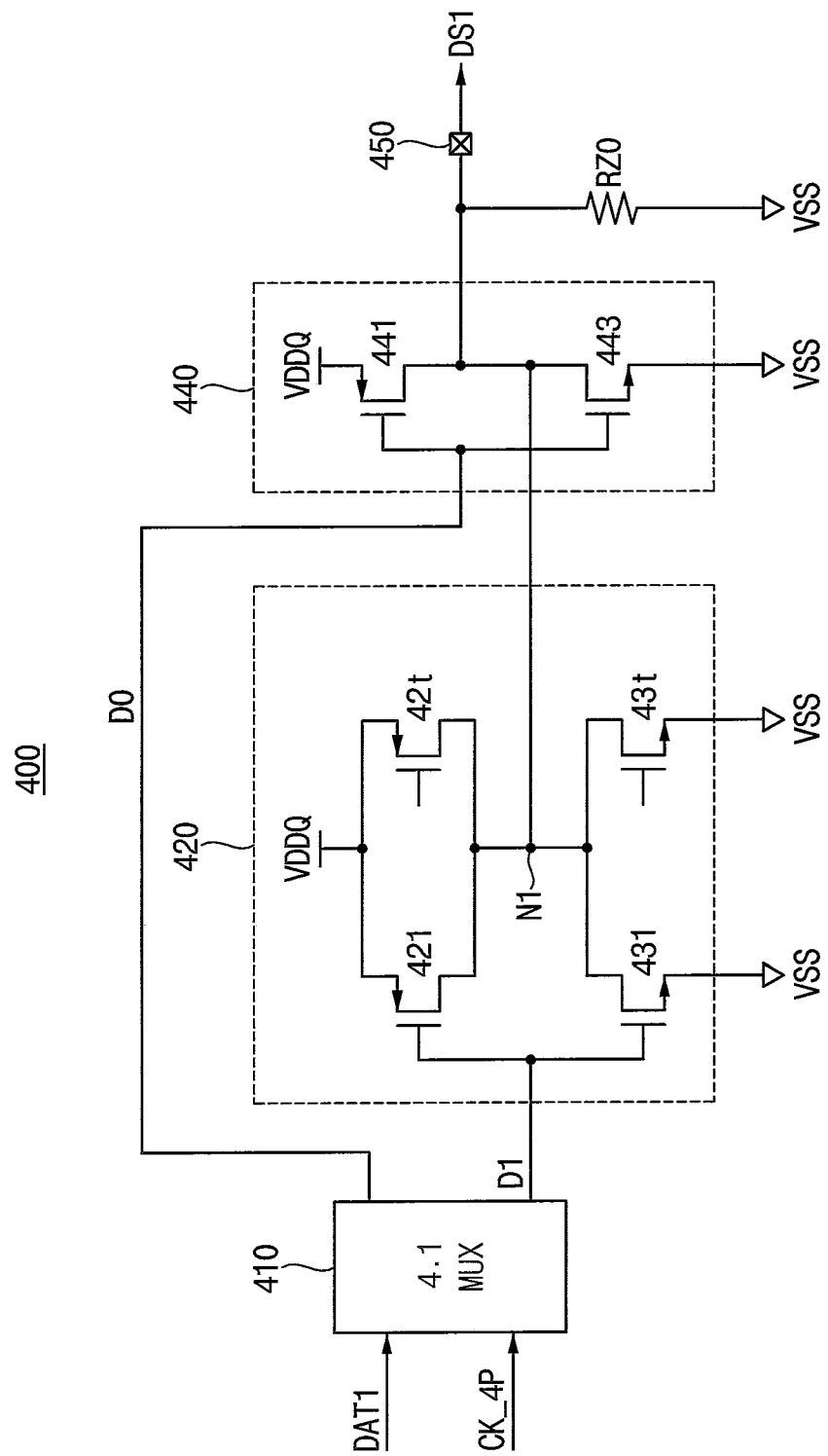
FIG. 8 is a block diagram illustrating an example of a transmitter according to one or more example embodiments.

FIG. 8 is a block diagram illustrating an example of a transmitter according to one or more example embodiments.

Referring to FIG. 8, a transmitter 400 includes a multiplexer 410, a first driver 420 and a second driver 440. The transmitter 400 may further include a termination resistor RZQ coupled between a data I/O pad 450 and the ground voltage VSS.

The multiplexer 410 may divide the input data DAT1 to a first bit D0 and a second bit D1 based on a four-phase clock signal CK_4P. The first bit D0 may be a least significant bit (LSB) of the input data DAT1 and the second bit D1 may be a most significant bit (MSB) of the input data DAT1. The multiplexer 410 may provide the second bit D1 to the first driver 420 and may provide the first bit D0 to the second driver 440. According to an example embodiment, the multiplexer 410 may be a 4:1 MUX. Although FIG. 8 illustrates four-phase clock signal CK_4P and a 4:1 MUX, the disclosure is not limited thereto, and other type of clock signal and MUX may be provided according to other example embodiments.

The first driver 420 includes a plurality of p-channel metal metal-oxide semiconductor (PMOS) transistors 421~42$t$ which are connected in parallel between a power supply voltage VDDQ and a node N1 and a plurality of n-channel metal metal-oxide semiconductor (NMOS) transistors 431~43$t$ which are connected in parallel between the node N1 and the ground voltage VSS. Here, t is an integer greater than one. The second bit D1 may be applied to each gate of the PMOS transistors 421~42$t$ and each gate of the NMOS transistors 431~43$t$.

The second driver 440 is connected between the node N1 and the data I/O pad 450. The second driver 440 includes a PMOS transistor 441 and an NMOS transistor 443. The PMOS transistor 441 is connected between the power supply voltage VDDQ and the node N1 and the NMOS transistor 443 is connected between the node N1 and the ground voltage VSS. Gate of the PMOS transistor 441 and the NMOS transistor 443 are coupled to each other and may receive the first bit D0.

According to an example embodiment, the first driver 420 includes a plurality of inverters and drives the second bit D1 to the data I/O pad 450 and the second driver 440 drives the first bit D0 to the data I/O pad 450 to generate the output data signal DS1 that is a multi-level signal. The data I/O pad 450 may output the output data signal DS1 and the output data signal DS1 may have one of first through fourth voltage levels. The output data signal DS1 may correspond to the data signal in FIGS. 6 and 7 and may have one of first through fourth voltage levels VL11, VL21, VL31 and VL41.

Figure 9:
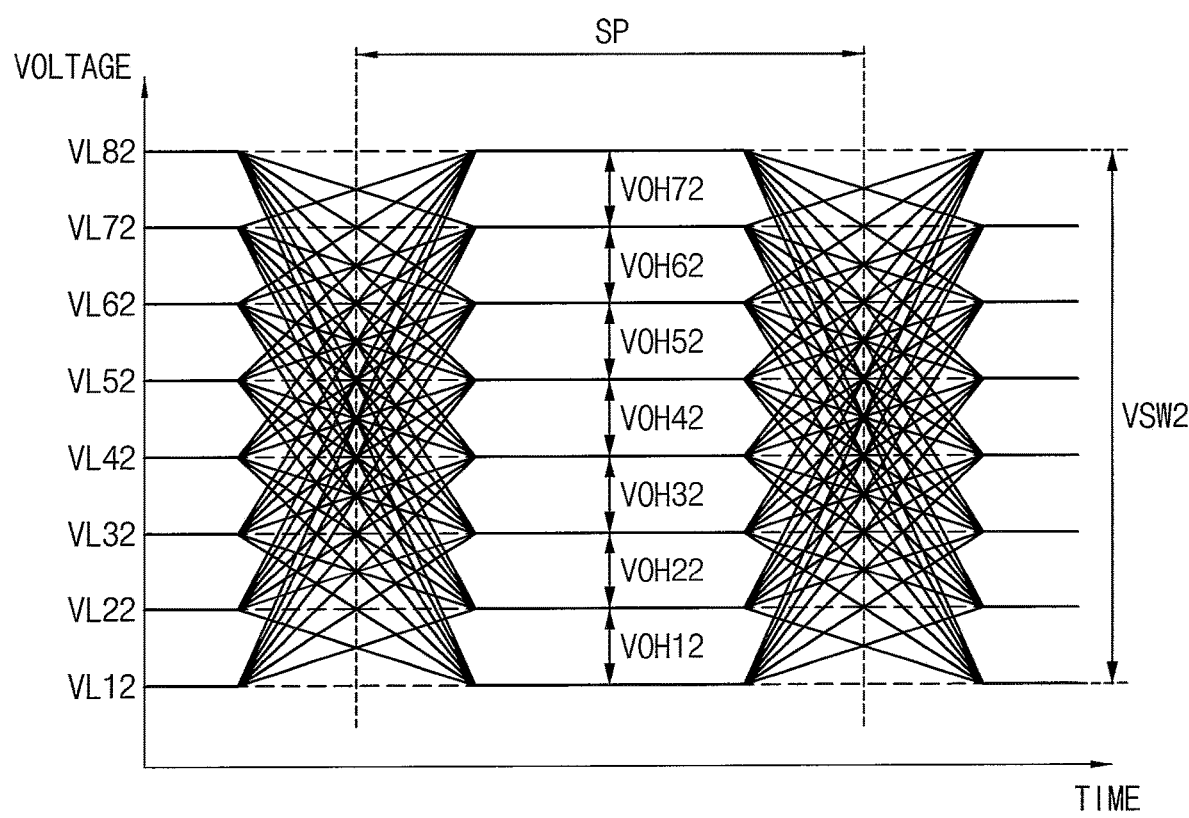
FIG. 9 is a diagram for describing a data signal generated by a method of generating a multi-level signal according to one or more example embodiments.

FIG. 9 is a diagram for describing a data signal generated by a method of generating a multi-level signal according to another example embodiment. The descriptions repeated with FIG. 7 will be omitted.

According to an example embodiment, FIG. 9 illustrates different first, second, third, fourth, fifth, sixth, seventh and eighth voltage levels VL12, VL22, VL32, VL42, VL52, VL62, VL72 and VL82 of a data signal that is generated based on an 8-level scheme, different first, second, third, fourth, fifth, sixth and seventh voltage intervals VOH12, VOH22, VOH32, VOH42, VOH52, VOH62 and VOH72 of the data signal and a voltage swing width VSW2 of the data signal. For example, the data signal is an eighth level pulse amplitude modulation (PAM-8) signal generated based on the eighth-level pulse amplitude modulation (PAM-8) signaling scheme. As described above, the selective level change for adjusting the voltage intervals and/or the voltage swing width may be performed.

Figure 10:
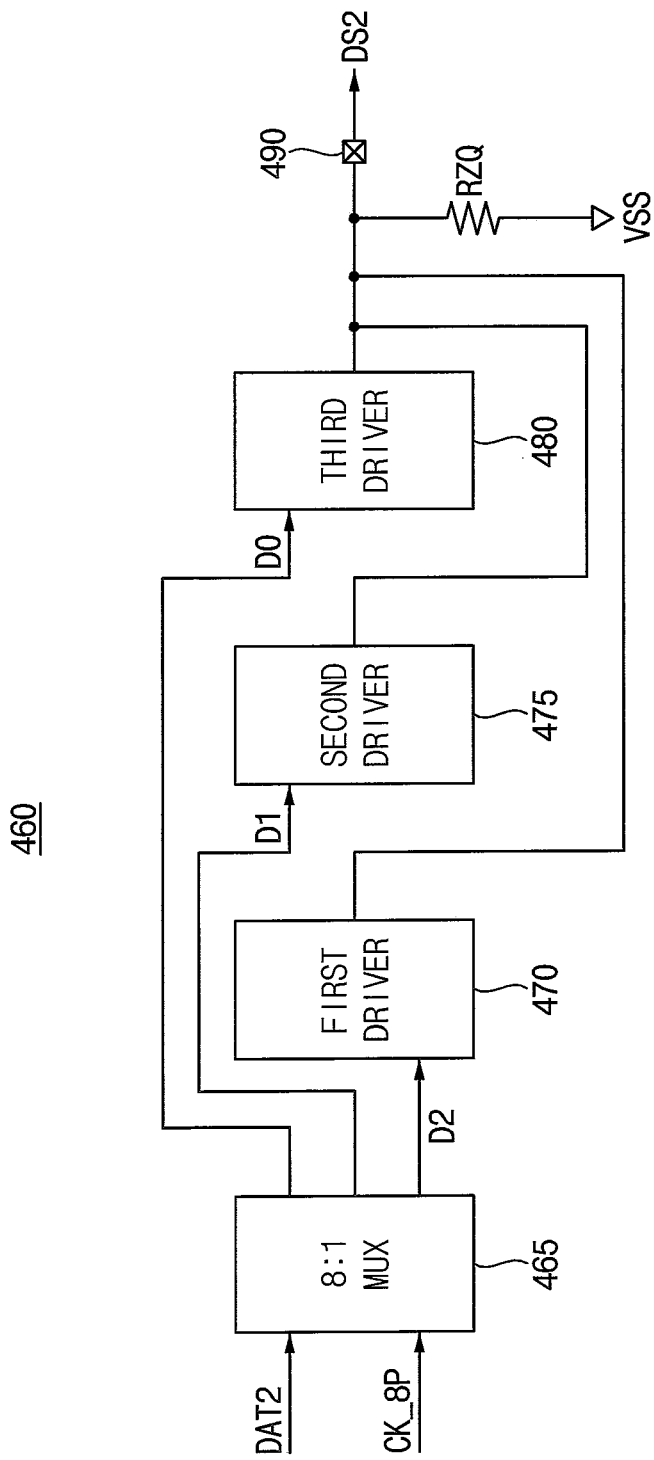
FIG. 10 is a block diagram illustrating another example of a transmitter according to example embodiments.

FIG. 10 is a block diagram illustrating another example of a transmitter according to one or more example embodiments.

Referring to FIG. 10, a transmitter 460 includes a multiplexer 465, a first driver 470, a second driver 475 and a third driver 480. The transmitter 400 may further include a termination resistor RZQ coupled between a data I/O pad 490 and the ground voltage VSS. The multiplexer 465 may be an 8:1 MUX.

The multiplexer 465 may divide the input data DAT2 to a first bit D0, a second bit D1 and a third bit D2 based the eight-phase clock signal CK_8P. The first bit D0 may be a least significant bit (LSB) of the input data DAT2, the second bit D1 may be a central significant bit (CSB) of the input data DAT2 and the third bit D2 may be a most significant bit (MSB) of the input data DAT1. The multiplexer 465 may provide the third bit D2 to the first driver 470, may provide the second bit D1 to the second driver 475 and may provide the first bit D0 to the third driver 480.

The first driver 470 drives the third bit D2 to the data I/O pad 490, the second driver 475 drives the second bit D1 to the data I/O pad 490 and the third driver 480 drives the first bit D0 to the data I/O pad 490. The data I/O pad 490 may output the output data signal DS2, the output data signal DS2 may correspond to the data signal in FIG. 9 and may have one of first through eighth voltage levels VL12~VL82 illustrated in in FIG. 9.

Figure 11:
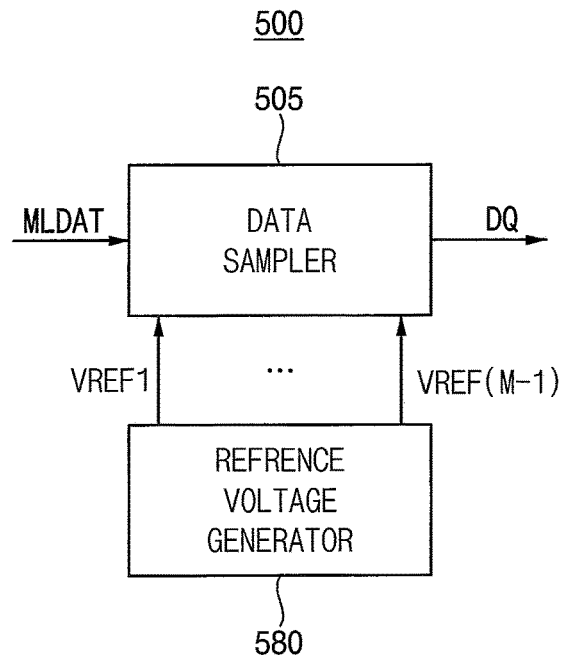
FIG. 11 is a block diagram illustrating a multi-level signal receiver according to example embodiments.

FIG. 11 is a block diagram illustrating a multi-level signal receiver according to one or more example embodiments.

Referring to FIG. 11, a multi-level signal receiver 500 may include a data sampler 505 and a reference voltage generator 580.

The data sampler 505 receives a multi-level (data) signal MLDAT having one of M voltage levels different from each other, compares the multi-level signal MLDAT with (M−1) reference voltages VREF1~VREF(M−1) and generates target data signal DQ including N bits. Here, M is an integer greater than two and N is an integer greater than one. The data sampler 510 may include M−1 sense amplifiers and at least two sense amplifiers of the (M−1) sense amplifiers may include different types of sense amplifiers having different sensing characteristics.

The reference voltage generator 580 may generate the (M−1) reference voltages VREF1~VREF(M−1) and may provide the (M−1) reference voltages VREF1~VREF(M−1) to the data sampler 505.

Figure 12A:
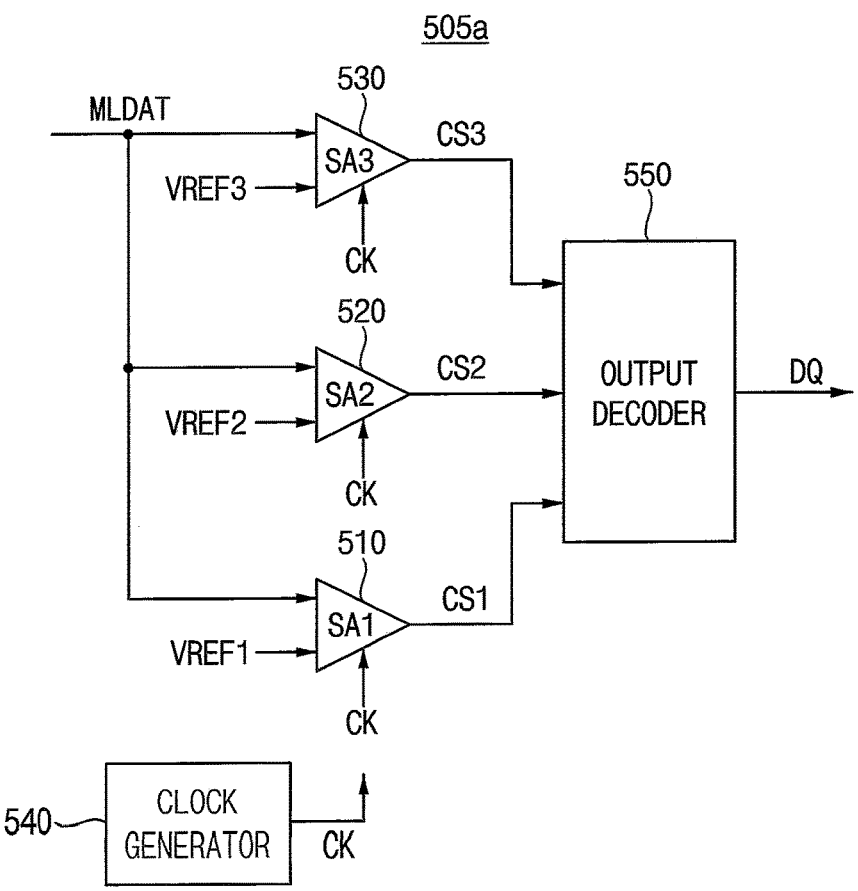
FIG. 12A is a block diagram illustrating an example of the data sampler in the multi-level signal receiver of FIG. 11 according to example embodiments.

FIG. 12A is a block diagram illustrating an example of the data sampler 505 in the multi-level signal receiver 500 of FIG. 11 according to an example embodiment, in which, it is assumed that M is four and N is two. However, the disclosure is note limited thereto, and as such, according to another example embodiment, M may be any integer greater than two and N may be an integer greater than one.

Referring to FIG. 12A, a data sampler 505a may include sense amplifiers 510, 520 and 530, a clock generator 540 and an output decoder 550.

The clock generator 540 generates the clock signal CK and provides the clock signal CK to the first through sense amplifiers 510, 520 and 530. According to an example embodiment, the clock generator 540 may generate a double data rate (DDR) clock signal, a four-phase clock signal or an eight-phase clock signal.

The first sense amplifier 510 may compare the multi-level signal MLDAT with a first reference voltage VREF1 based on the clock signal CK and output a first comparison signal CS1 to the output decoder 550. The second sense amplifier 520 may compare the multi-level signal MLDAT with a second reference voltage VREF2 based on the clock signal CK and output a second comparison signal CS2 to the output decoder 550. The third sense amplifier 530 may compare the multi-level signal MLDAT with a third reference voltage VREF3 based on the clock signal CK and output a third comparison signal CS3 to the output decoder 550.

As described with reference FIG. 7, when M corresponds to four, the multi-level signal MLDAT may have one of the first through fourth voltage levels VL11, VL21, VL31 and VL41, the first reference voltage VREF1 may be set to have a level between the first voltage level VL11 and the second voltage level VL21, the second reference voltage VREF2 may be set to have a level between the second voltage level VL21 and the third voltage level VL31, and the third reference voltage VREF3 may be set to have a level between the third voltage level VL31 and the fourth voltage level VL41. Therefore, the second reference voltage VREF2 may have a voltage level greater than a voltage level of the first reference voltage VREF1 and the third reference voltage VREF3 may have a voltage level greater than the voltage level of the second reference voltage VREF2.

The output decoder 550 may decode the first comparison signal CS1, the second comparison signal CS2 and the third comparison signal CS3 may determine data bits corresponding to the multi-level signal MLDAT based on levels of the first comparison signal CS1, the second comparison signal CS2 and the third comparison signal CS3 and may output the target data signal DQ indicating the determined data bits.

For example, when the first comparison signal CS1, the second comparison signal CS2 and the third comparison signal CS3 indicate that a voltage level of the multi-level signal MLDAT is greater than the third reference voltage VREF3, the output decoder 550 may output the target data signal DQ corresponding to '11'. For example, when the first comparison signal CS1, the second comparison signal CS2 and the third comparison signal CS3 indicate that the voltage level of the multi-level signal MLDAT is smaller than the third reference voltage VREF3 and greater than the second reference voltage VREF2, the output decoder 550 may output the target data signal DQ corresponding to '10'.

For example, when the first comparison signal CS1, the second comparison signal CS2 and the third comparison signal CS3 indicate that the voltage level of the multi-level signal MLDAT is smaller than the second reference voltage VREF2 and greater than the first reference voltage VREF1, the output decoder 550 may output the target data signal DQ corresponding to '01'. For example, when the first comparison signal CS1, the second comparison signal CS2 and the third comparison signal CS3 indicate that the voltage level of the multi-level signal MLDAT is smaller than the first reference voltage VREF1, the output decoder 550 may output the target data signal DQ corresponding to '00'.

Figure 12B:
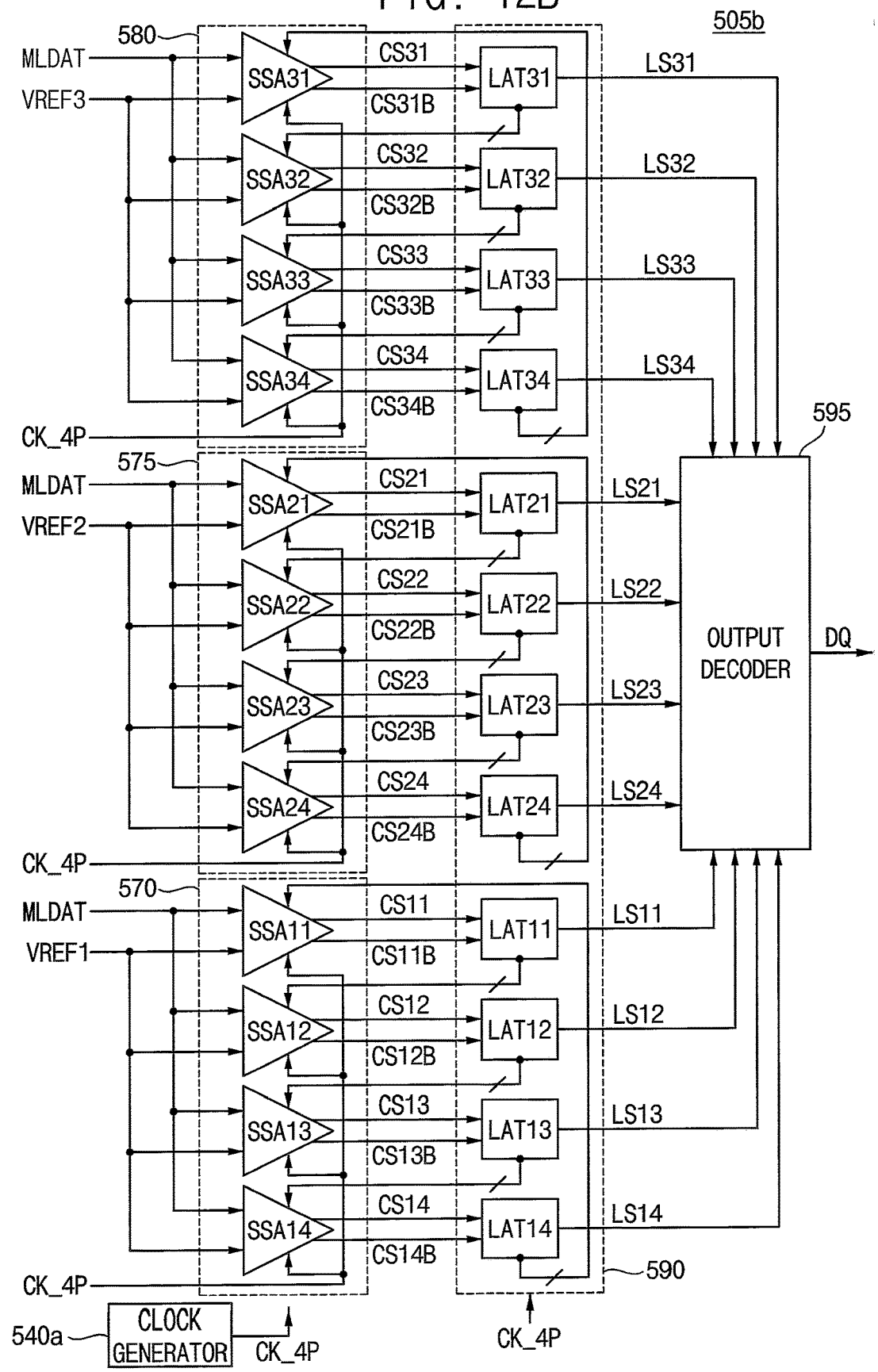
FIG. 12B is a block diagram illustrating another example of the data sampler in the multi-level signal receiver of FIG. 11 according to one or more example embodiments.

FIG. 12B is a block diagram illustrating another example of the data sampler 505 in the multi-level signal receiver of 500 FIG. 11 according to another example embodiment, in which, it is assumed that M is four and N is two.

Referring to FIG. 12B, a data sampler 505b may include sense amplifiers 570, 575 and 580, a clock generator 540a, a latch circuit 590 and an output decoder 595.

The clock generator 540a may generate a four-phase clock signal CK_4P and provides the clock signal CK_4P to the first through sense amplifiers 570, 575, and 580 and the latch circuit 590.

The first sense amplifier 570 may include first through fourth sub sense amplifier SSA11~SSA14, the second sense amplifier 575 may include first through fourth sub sense amplifier SSA21~SSA24, and the third sense amplifier 580 may include first through fourth sub sense amplifier SSA31~SSA34.

The latch circuit 590 may include latches LAT11~LAT14 corresponding to the first through fourth sub sense amplifiers SSA11~SSA14, latches LAT21~LAT24 corresponding to the first through fourth sub sense amplifiers SSA21~SSA24 and latches LAT31~LAT34 corresponding to the first through fourth sub sense amplifiers SSA31~SSA34.

Each of the first through fourth sub sense amplifiers SSA11~SSA14 may compare the multi-level signal MLDAT with the first reference voltage VREF1 at every phase of the four-phase clock signal CK_4P and may provide respective one of the latches LAT11~LAT14 with respective one of first comparison signals CS11~CS14 and respective one of first inverted comparison signals CS11B~CS14B based on a result of the comparison. Each of the latches LAT11~LAT14 may latch respective one of the first comparison signals CS11~CS14 and respective one of the first inverted comparison signals CS11B~CS14B to output respective one of latch signals LS11~LS14. Internal signals of the latches LAT11~LAT14 may correspond to a differential type and may fed-back to the first through fourth sub sense amplifiers SSA11~SSA14. For example, an internal signal of latch LAT11 may be provided the sub sense amplifier SSA12, an internal signal of the latch LAT12 may be provided to the sub sense amplifier SSA13, an internal signal of the latch LAT13 may be provided to the sense amplifier SSA14 and an internal signal of the latch LAT14 may be provided to the sub sense amplifier SSA11.

Each of the first through fourth sub sense amplifiers SSA21~SSA24 may compare the multi-level signal MLDAT with the second reference voltage VREF2 at every phase of the four-phase clock signal CK_4P and may provide respective one of the latches LAT21~LAT24 with respective one of second comparison signals CS21~CS24 and respective one of second inverted comparison signals CS21B~CS24B based on a result of the comparison. Each of the latches LAT21~LAT24 may latch respective one of the second comparison signals CS21~CS24 and respective one of the second inverted comparison signals CS21B~CS24B to output respective one of latch signals LS21~LS24. Internal signals of the latches LAT21~LAT24 may correspond to a differential type and may fed-back to the first through fourth sub sense amplifiers SSA21~SSA24. For example, an internal signal of latch LAT21 may be provided the sub sense amplifier SSA22, an internal signal of the latch LAT22 may be provided to the sub sense amplifier SSA23, an internal signal of the latch LAT23 may be provided to the sense amplifier SSA24 and an internal signal of the latch LAT24 may be provided to the sub sense amplifier SSA21.

Each of the first through fourth sub sense amplifiers SSA31~SSA34 may compare the multi-level signal MLDAT with the third reference voltage VREF3 at every phase of the four-phase clock signal CK_4P and may provide respective one of the latches LAT31~LAT34 with respective one of third comparison signals CS31~CS34 and respective one of third inverted comparison signals CS31B~CS34B based on a result of the comparison. Each of the latches LAT31~LAT34 may latch respective one of the third comparison signals CS31~CS34 and respective one of the third inverted comparison signals CS31B~CS34B to output respective one of latch signals LS31~LS34. Internal signals of the latches LAT31~LAT34 may correspond to a differential type and may fed-back to the first through fourth sub sense amplifiers SSA31~SSA34. For example, an internal signal of latch LAT31 may be provided the sub sense amplifier SSA32, an internal signal of the latch LAT32 may be provided to the sub sense amplifier SSA33, an internal signal of the latch LAT33 may be provided to the sense amplifier SSA34 and an internal signal of the latch LAT34 may be provided to the sub sense amplifier SSA31.

The output decoder 595 may decode the latch signal LS11~LS14, the latch signals LS21~LS24 and the latch signals LS31~LS34 to output the target data signal DQ indicating the determined data bits.

Figure 13:
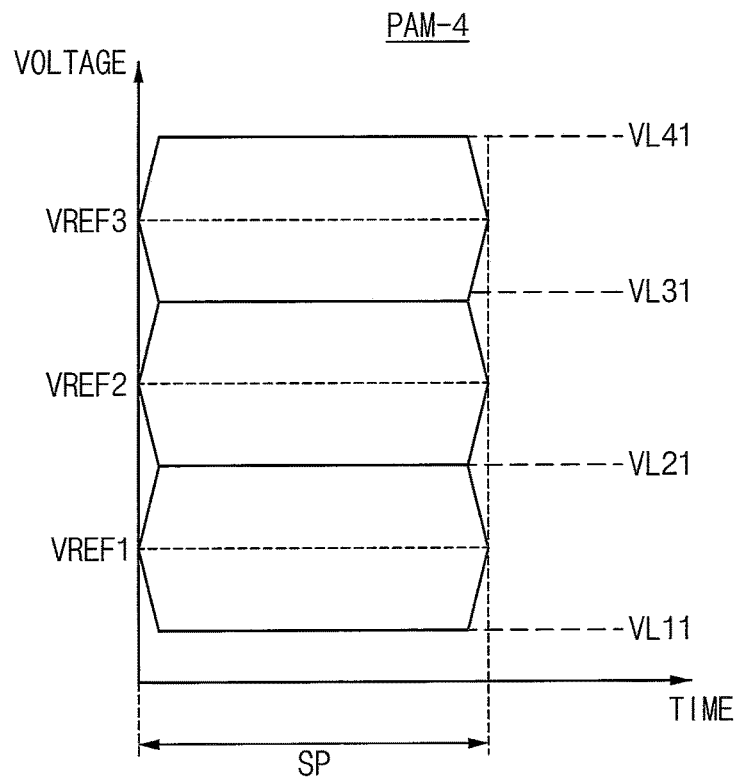
FIG. 13 illustrates the multi-level signal and the reference voltages.

FIG. 13 illustrates the multi-level (PAM4) signal and the reference voltages according to an example embodiment.

Referring to FIG. 13, the multi-level signal MLDAT may have one of the first through fourth voltage levels VL11, VL21, VL31 and VL41. Moreover, the first reference voltage VREF1 may be set to have a level between the first voltage level VL11 and the second voltage level VL21, the second reference voltage VREF2 may be set to have a level between the second voltage level VL21 and the third voltage level VL31, and the third reference voltage VREF3 may be set to have a level between the third voltage level VL31 and the fourth voltage level VL41.

Figure 14:
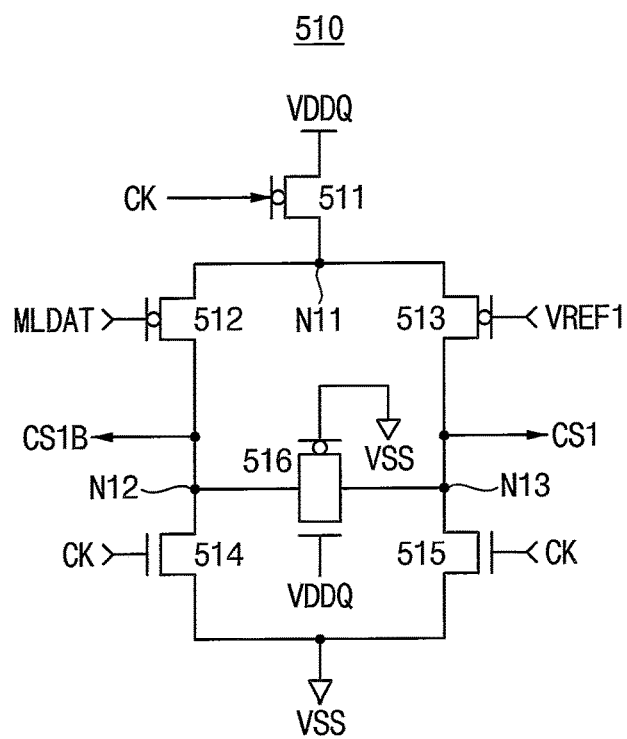
FIG. 14 is a circuit diagram illustrating an example of the first sense amplifier according to one or more example embodiments.

FIG. 14 is a circuit diagram illustrating an example of the first sense amplifier according to one or more example embodiments.

Referring to FIG. 14, the first sense amplifier 510 may include first through third default PMOS transistors 511, 512 and 513, a default transmission gate 516 and first and second default NMOS transistors 514 and 515.

The first default PMOS transistor 511 is connected between the power supply voltage VDDQ and a first internal node N11 and has a gate that receives the clock signal CK. The second default PMOS transistor 512 is connected between the first internal node N11 and a second internal node N12 and has a gate that receives the multi-level signal MLDAT. The third default PMOS transistor 513 is connected between the first internal node N11 and a third internal node N13 and has a gate that receives the first reference voltage VREF1.

The default transmission gate 516 is connected between the second internal node N12 and the third internal node N13 and is connected to the ground voltage VSS and the power supply voltage VDDQ. The first default NMOS transistor 514 is connected between the second internal node N12 and the ground voltage VSS and has a gate that receives the clock signal CK. The second default NMOS transistor 515 is connected between the third internal node N13 and the ground voltage VDDQ and has a gate that receives the clock signal CK.

The default transmission gate 516 may include a PMOS transistor coupled to the power supply voltage VDDQ and an NMOS transistor coupled to the ground voltage VSS. The default transmission gate 516 may be replaced with one of a PMOS transistors coupled to the power supply voltage VDDQ and an NMOS transistor coupled to the ground voltage VSS.

When the first default PMOS transistor 511 are turned-on in response to the clock signal CK, the first default NMOS transistor 514 and the second NMOS transistor 515 are turned-off. Therefore, currents corresponding to voltage difference between the multi-level signal MLDAT and the first reference voltage VREF1 are provided to the second internal node N12 and the third internal node N13 respectively. Moreover, the default transmission gate 516 is turned-on based on the currents corresponding to voltage difference between the multi-level signal MLDAT and the first reference voltage VREF1, and the first sense amplifier 510 may provide the first comparison single CS1 based on potential difference between the second internal node N12 and the third internal node N13 at the third internal node N13. When the first default NMOS transistor 514 and the second NMOS transistor 515 are turned-on in response to the clock signal CK, the second internal node N12 and the third internal node N13 are discharged to the ground voltage VSS. The above description on operation of the first sense amplifier 510 may be similarly applied to third sense amplifiers 530a, 530b, 530c, 530d and 530e in FIGS. 15 through 19.

Therefore, the first sense amplifier 510 may compare the multi-level signal MLDAT and the first reference voltage VREF1, may output the first comparison single CS1 at the third internal node N13 and may output a first inverted comparison single CS1B at the second internal node N12.

The second sense amplifier 520 in FIG. 12A may have a same configuration as a configuration of the first sense amplifier 510 of FIG. 14. That is, the first type of the sense amplifier may have the configuration in FIG. 14.

Figure 15:
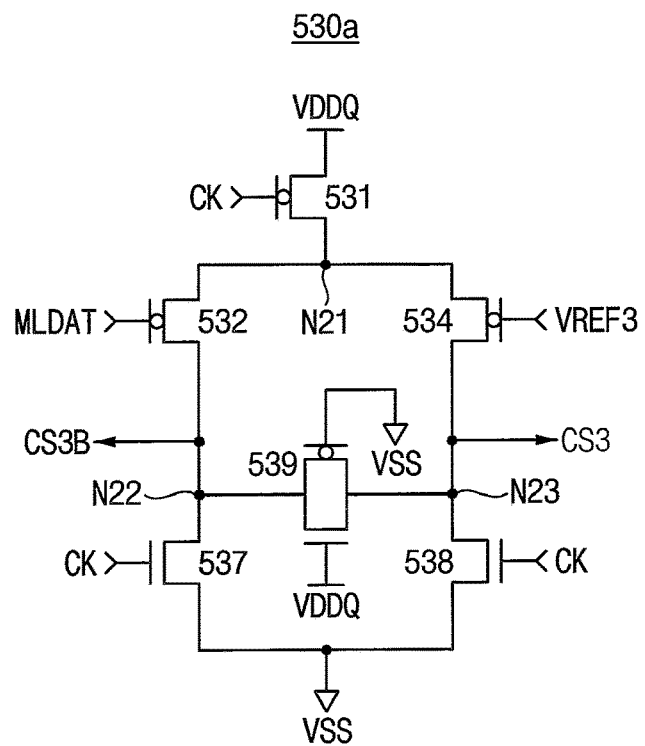
FIG. 15 is a circuit diagram illustrating an example of the third sense amplifier according to one or more example embodiments.

FIG. 15 is a circuit diagram illustrating an example of the third sense amplifier according to one or more example embodiments.

Referring to FIG. 15, a third sense amplifier 530a may include first through third PMOS transistors 531, 532 and 534, a transmission gate 539 and first and second NMOS transistors 537 and 538.

The first PMOS transistor 531 is connected between the power supply voltage VDDQ and a first node N21 and has a gate that receives the clock signal CK. The second PMOS transistor 532 is connected between the first node N21 and a second node N22 and has a gate that receives the multi-level signal MLDAT. The third PMOS transistor 534 is connected between the first node N21 and a third node N23 and has a gate that receives the third reference voltage VREF3.

The transmission gate 539 is connected between the second node N22 and the third node N23 and is connected to the ground voltage VSS and the power supply voltage VDDQ. The first NMOS transistor 537 is connected between the second node N22 and the ground voltage VSS and has a gate that receives the clock signal CK. The second NMOS transistor 538 is connected between the third node N23 and the ground voltage VDDQ and has a gate that receives the clock signal CK. The transmission gate 539 may include a PMOS transistors coupled to the power supply voltage VDDQ and an NMOS transistor coupled to the ground voltage VSS. The transmission gate 539 may be replaced with one of a PMOS transistors coupled to the power supply voltage VDDQ and an NMOS transistor coupled to the ground voltage VSS.

Therefore, the third sense amplifier 530a may compare the multi-level signal MLDAT and the third reference voltage VREF3, may output the third comparison single CS3 at the third node N23 and may output a third inverted comparison single CS3B at the second node N22.

According to an example embodiment, each threshold voltage of the second PMOS transistor 532 and the third PMOS transistor 534 is smaller than each threshold voltage of the second default PMOS transistor 512 and the third default PMOS transistor 513. Therefore, the first sense amplifier 510 and the third sense amplifier 530a have the first sensing characteristic and the second sensing characteristic with respect to the first reference voltage VREF1 and the third reference voltage VREF3, respectively, based on difference of the threshold voltages.

The third reference voltage VREF3 is applied to the gate of the third PMOS transistor 534 and the first reference voltage VREF1 whose level is smaller than a level of the third reference voltage VREF3 is applied to the gate of the third default PMOS transistor 513. If the threshold voltages of the third PMOS transistor 534 and the third default PMOS transistor 513 are the same, the second sensing characteristic of the third sense amplifier 530a may be worse than the first sensing characteristic of the first sense amplifier 510.

Since the threshold voltage of the third PMOS transistor 534 is smaller than the threshold voltage of the third default PMOS transistor 513, the third PMOS transistor 534 is turned-on in response to a voltage level which is greater than a voltage level which turns-on the third default PMOS transistor 513, the second sensing characteristic of the third sense amplifier 530a may be enhanced. The above description on sensing characteristic may be similarly applied to third sense amplifiers 530b, 530c, 530d and 530e in FIGS. 16 through 19.

Figure 16:
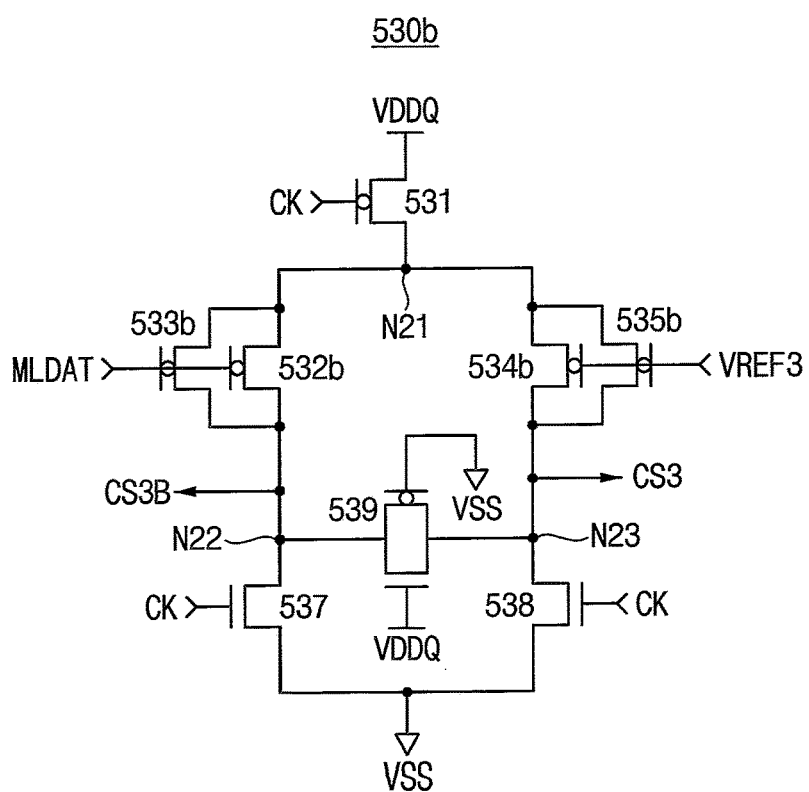
FIG. 16 is a circuit diagram illustrating another example of the third sense amplifier according to one or more example embodiments.

FIG. 16 is a circuit diagram illustrating an example of the third sense amplifier according to another example embodiment.

Referring to FIG. 16, a third sense amplifier 530b may include first through fifth PMOS transistors 531, 532b, 533b and 534b, 535b, a transmission gate 539 and first and second NMOS transistors 537 and 538.

The first PMOS transistor 531 is connected between the power supply voltage VDDQ and a first node N21 and has a gate that receives the clock signal CK. The second and third PMOS transistors 532b and 533b are connected in parallel between the first node N21 and a second node N22 and have gates that receive the multi-level signal MLDAT. The fourth and fifths PMOS transistors 534b and 535b are connected in parallel between the first node N21 and a third node N23 and have gates that receive the third reference voltage VREF3.

The transmission gate 539 is connected between the second node N22 and the third node N23 and is connected to the ground voltage VSS and the power supply voltage VDDQ. The first NMOS transistor 537 is connected between the second node N22 and the ground voltage VSS and has a gate that receives the clock signal CK. The second NMOS transistor 538 is connected between the third node N23 and the ground voltage VDDQ and has a gate that receives the clock signal CK. The transmission gate 539 may include a PMOS transistors coupled to the power supply voltage VDDQ and an NMOS transistor coupled to the ground voltage VSS. The transmission gate 539 may be replaced with one of a PMOS transistors coupled to the power supply voltage VDDQ and an NMOS transistor coupled to the ground voltage VSS.

Therefore, the third sense amplifier 530b may compare the multi-level signal MLDAT and the third reference voltage VREF3, may output the third comparison single CS3 at the third node N23 and may output the third inverted comparison single CS3B at the second node N22.

In embodiments, each threshold voltage of the second through fifth PMOS transistors 531, 532b, 533b and 534b, 535b is smaller than each threshold voltage of the second default PMOS transistor 512 and the third default PMOS transistor 513. Therefore, the first sense amplifier 510 and the third sense amplifier 530b have the first sensing characteristic and the second sensing characteristic with respect to the first reference voltage VREF1 and the third reference voltage VREF3, respectively, based on difference of the threshold voltages.

In FIG. 16, the second and third PMOS transistors 532b and 533b that receives the multi-level signal MLDAT are disposed in parallel between the first node N21 and a second node N22 and the fourth and fifths PMOS transistors 534b and 535b that receives the third reference voltage VREF3 are disposed in parallel between the first node N21 and the third node N23. Therefore, a channel width over a channel length of a PMOS transistor that receives the third reference voltage VREF3 is increased.

Figure 17:
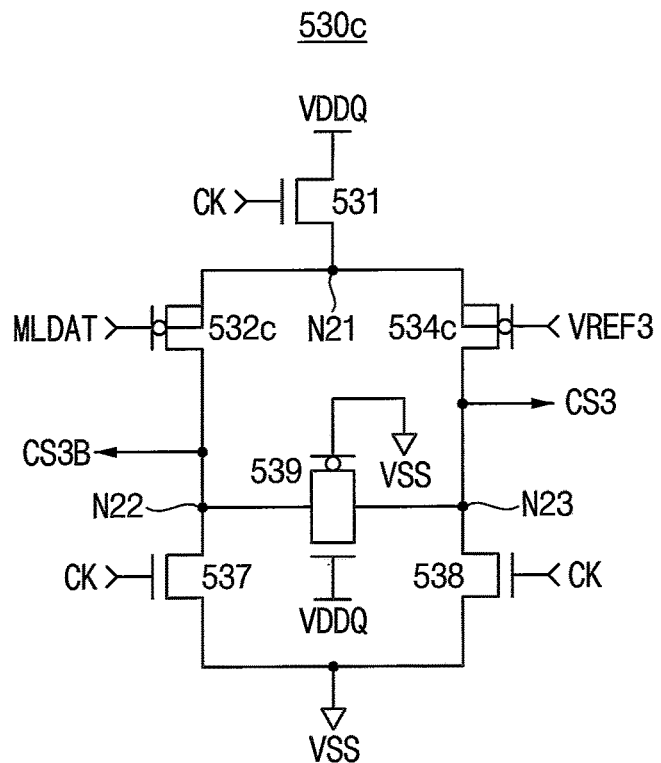
FIG. 17 is a circuit diagram illustrating another example of the third sense amplifier according to one or more example embodiments.

FIG. 17 is a circuit diagram illustrating an example of the third sense amplifier according to example embodiments.

Referring to FIG. 17, a third sense amplifier 530c may include first through third PMOS transistors 531, 532c and 534c, a transmission gate 539 and first and second NMOS transistors 537 and 538.

The first PMOS transistor 531 is connected between the power supply voltage VDDQ and a first node N21 and has a gate that receives the clock signal CK. The second PMOS transistor 532c is connected between the first node N21 and a second node N22 and has a source coupled to the first node N21, a drain coupled to the second node N22, a gate that receives the multi-level signal MLDAT and a body coupled to the first node N21. The third PMOS transistor 534c is connected between the first node N21 and the third node N23 and has a source coupled to the first node N21, a drain coupled to the third node N23, a gate that receives the third reference voltage VREF3 and a body coupled to the first node N21.

The transmission gate 539 is connected between the second node N22 and the third node N23 and is connected to the ground voltage VSS and the power supply voltage VDDQ. The first NMOS transistor 537 is connected between the second node N22 and the ground voltage VSS and has a gate that receives the clock signal CK. The second NMOS transistor 538 is connected between the third node N23 and the ground voltage VDDQ and has a gate that receives the clock signal CK. The transmission gate 539 may include a PMOS transistors coupled to the power supply voltage VDDQ and an NMOS transistor coupled to the ground voltage VSS. The transmission gate 539 may be replaced with one of a PMOS transistors coupled to the power supply voltage VDDQ and an NMOS transistor coupled to the ground voltage VSS.

Therefore, the third sense amplifier 530c may compare the multi-level signal MLDAT and the third reference voltage VREF3, may output the third comparison single CS3 at the third node N23 and may output the third inverted comparison single CS3B at the second node N22.

According to an example embodiment, each threshold voltage of the second and third PMOS transistors 531, 532c, and 534c is smaller than each threshold voltage of the second default PMOS transistor 512 and the third default PMOS transistor 513. Therefore, the first sense amplifier 510 and the third sense amplifier 530c have the first sensing characteristic and the second sensing characteristic with respect to the first reference voltage VREF1 and the third reference voltage VREF3, respectively, based on difference of the threshold voltages.

In FIG. 17, each body of the second and third PMOS transistors 532c and 534c is coupled to its source, respectively, and each threshold voltage of the second and third PMOS transistors 532c and 534c may be lowered. Therefore, the third PMOS transistor 534c is turned-on in response to a voltage level which is greater than a voltage level which turns-on the third default PMOS transistor 513, the second sensing characteristic of the third sense amplifier 530c may be enhanced.

Figure 18:
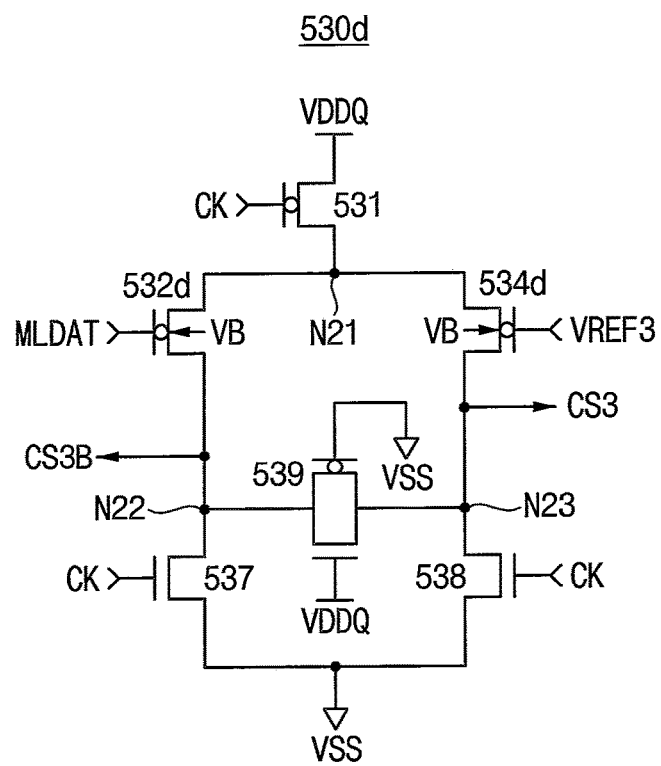
FIG. 18 is a circuit diagram illustrating another example of the third sense amplifier according to one or more example embodiments.

FIG. 18 is a circuit diagram illustrating an example of the third sense amplifier according to example embodiments.

Referring to FIG. 18, a third sense amplifier 530d may include first through third PMOS transistors 531, 532d and 534d, a transmission gate 539 and first and second NMOS transistors 537 and 538.

The first PMOS transistor 531 is connected between the power supply voltage VDDQ and a first node N21 and has a gate that receives the clock signal CK. The second PMOS transistor 532d is connected between the first node N21 and a second node N22 and has a source coupled to the first node N21, a drain coupled to the second node N22, a gate that receives the multi-level signal MLDAT and a body coupled to a bias voltage VB. The third PMOS transistor 534d is connected between the first node N21 and the third node N23 and has a source coupled to the first node N21, a drain coupled to the third node N23, a gate that receives the third reference voltage VREF3 and a body coupled to the bias voltage VB.

The transmission gate 539 is connected between the second node N22 and the third node N23 and is connected to the ground voltage VSS and the power supply voltage VDDQ. The first NMOS transistor 537 is connected between the second node N22 and the ground voltage VSS and has a gate that receives the clock signal CK. The second NMOS transistor 538 is connected between the third node N23 and the ground voltage VDDQ and has a gate that receives the clock signal CK. The transmission gate 539 may include a PMOS transistors coupled to the power supply voltage VDDQ and an NMOS transistor coupled to the ground voltage VSS. The transmission gate 539 may be replaced with one of a PMOS transistors coupled to the power supply voltage VDDQ and an NMOS transistor coupled to the ground voltage VSS.

Therefore, the third sense amplifier 530d may compare the multi-level signal MLDAT and the third reference voltage VREF3, may output the third comparison single CS3 at the third node N23 and may output the third inverted comparison single CS3B at the second node N22.

According to an example embodiment, since each body of the second and the third PMOS transistors 532d and 534d is coupled to the bias voltage VB, each threshold voltage of the second and third PMOS transistors 531, 532c, and 534c is smaller than each threshold voltage of the second default PMOS transistor 512 and the third default PMOS transistor 513. Therefore, the first sense amplifier 510 and the third sense amplifier 530c have the first sensing characteristic and the second sensing characteristic with respect to the first reference voltage VREF1 and the third reference voltage VREF3, respectively, based on difference of the threshold voltages.

In FIG. 18, each body of the second and third PMOS transistors 532d and 534d is coupled to the bias voltage VB, respectively, and each threshold voltage of the second and third PMOS transistors 532c and 534c may be lowered. Therefore, the third PMOS transistor 534d is turned-on in response to a voltage level which is greater than a voltage level which turns-on the third default PMOS transistor 513, the second sensing characteristic of the third sense amplifier 530d may be enhanced.

Figure 19:
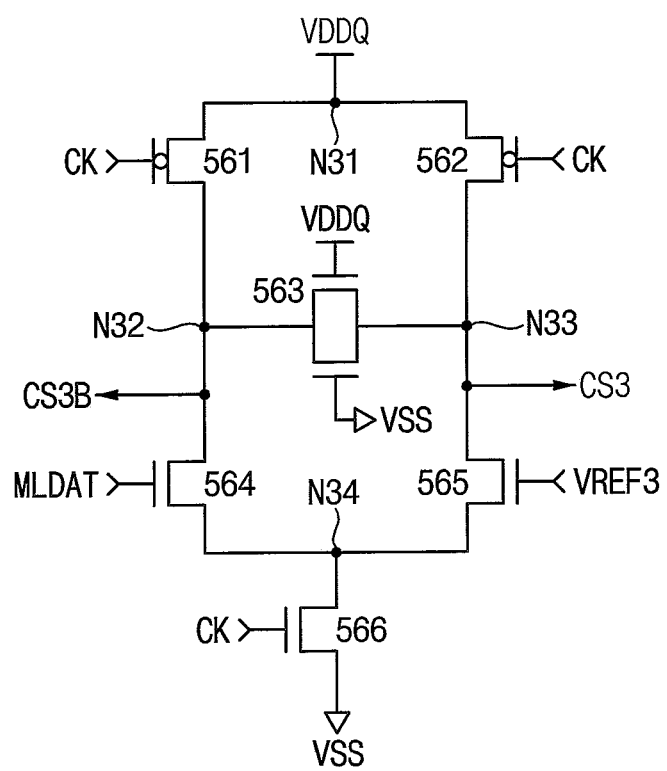
FIG. 19 is a circuit diagram illustrating another example of the third sense amplifier according to one or more example embodiments.

FIG. 19 is a circuit diagram illustrating an example of the third sense amplifier according to example embodiments.

Referring to FIG. 19, a third sense amplifier 530c may include first and second PMOS transistors 561 and 562, a transmission gate 563 and first through third NMOS transistors 564, 565 and 566.

The first PMOS transistor 561 is connected between a first node N31 coupled to the power supply voltage VDDQ and a second node N32 and has a gate that receives the clock signal CK. The second PMOS transistor 562 is connected between the first node N31 and a third node N33 and has a gate that receives the clock signal CK. The transmission gate 563 is connected between the second node N32 and the third node N33 and is connected to the ground voltage VSS and the power supply voltage VDDQ. The transmission gate 563 may include a PMOS transistors coupled to the power supply voltage VDDQ and an NMOS transistor coupled to the ground voltage VSS. The transmission gate 563 may be replaced with one of a PMOS transistors coupled to the power supply voltage VDDQ and an NMOS transistor coupled to the ground voltage VSS.

The first NMOS transistor 564 is connected between the second node N22 and a fourth node N34 and has a gate that receives the multi-level signal MLDAT. The second NMOS transistor 565 is connected between the third node N33 and the fourth node N34 and has a gate that receives the third reference voltage VREF3. The third NMOS transistor 566 is connected between the fourth node N34 and the ground voltage VSS and has a gate that receives the clock signal CK.

Therefore, the third sense amplifier 530e may compare the multi-level signal MLDAT and the third reference voltage VREF3, may output the third comparison single CS3 at the third node N33 and may output the third inverted comparison single CS3B at the second node N32.

According to an example embodiment, each threshold voltage of the second and third NMOS transistors 564 and 565 is different from each threshold voltage of the second default PMOS transistor 512 and the third default PMOS transistor 513. Therefore, the first sense amplifier 510 and the third sense amplifier 530c have the first sensing characteristic and the second sensing characteristic with respect to the first reference voltage VREF1 and the third reference voltage VREF3, respectively, based on difference of the threshold voltages.

In FIG. 19, since the second and third NMOS transistors 564 and 565 are included in the third sense amplifier 530e instead of the PMOS transistors, the second and third NMOS transistors 564 and 565 are easily turned-on as the voltages applied to the gates increase. Therefore, the third NMOS transistor 565 is turned-on in response to a voltage level which is greater than a voltage level which turns-on the third default PMOS transistor 513, the second sensing characteristic of the third sense amplifier 530e may be enhanced.

The second type of the sense amplifier may have a configuration of one in FIGS. 15 through 19.

Figure 20:
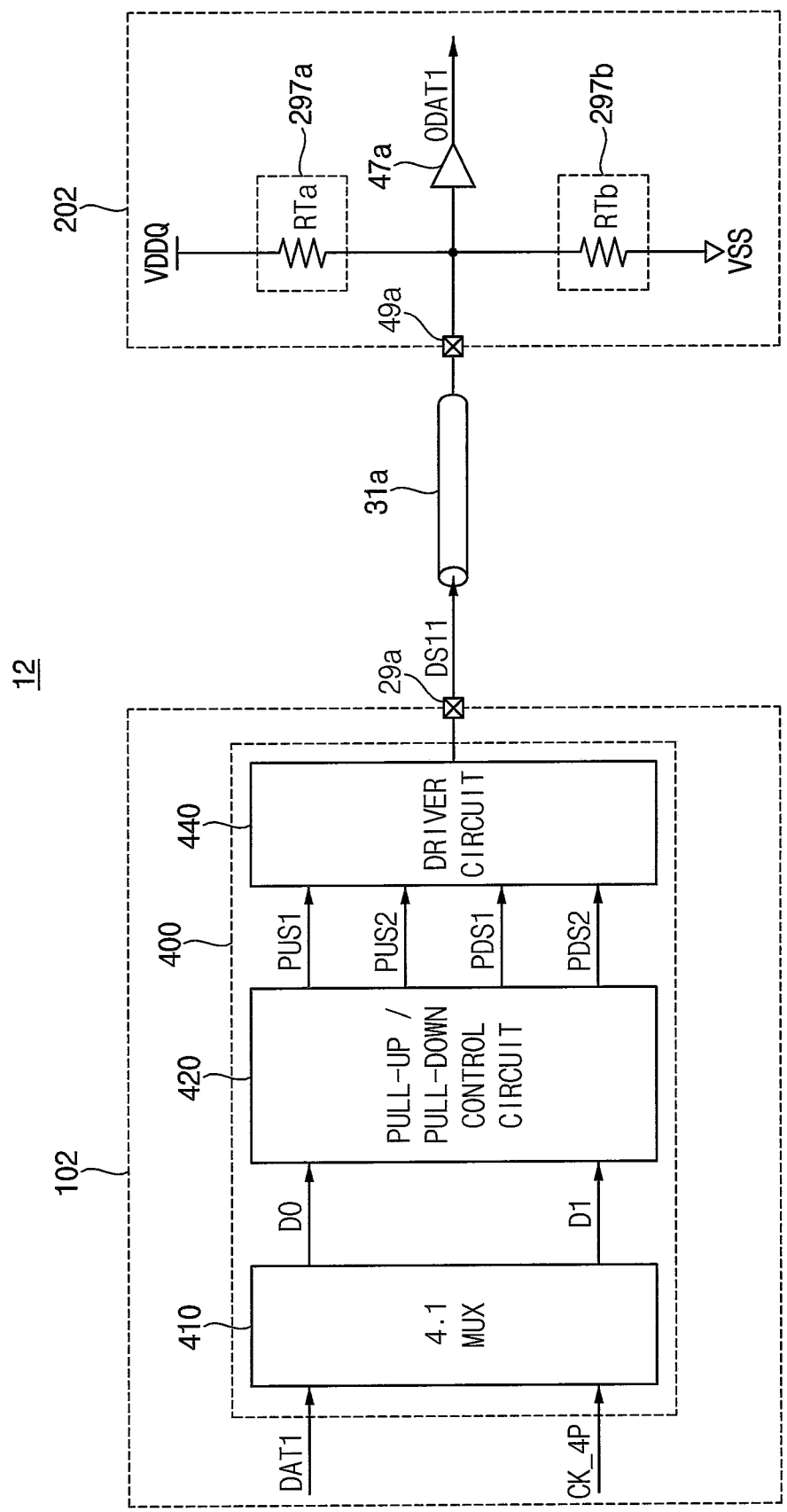
FIG. 20 is block diagrams illustrating an example of a memory system of FIG. 1 according to one or more example embodiments.

FIG. 20 is block diagrams illustrating an example of a memory system of FIG. 1 according to one or more example embodiments. The descriptions repeated with FIGS. 2 and 3 will be omitted.

Referring to FIG. 20, a memory system 12 includes a memory controller 102, a semiconductor memory device 202 and a channel 31a.

The memory controller 102 may include a transmitter 400a. The transmitter 400a includes a pull-up/pull-down control circuit 420, and a driver circuit 440. The transmitter 400a may further include a multiplexer 410 and a data I/O pad 29a.

The multiplexer 410 may receive input data DAT1 including two or more bits D0 and D1 and a clock signal (e.g., four-phase clock signal CK_4P), and may divide the input data DAT1 into the two or more bits D0 and D1. The pull-up/pull-down control circuit 420 generates two or more pull-up control signals PUS1 and PUS2 and two or more pull-down control signals PDS1 and PDS2 based on the input data DAT1 (e.g., the two or more bits D0 and D1). The driver circuit 440 generates an output data signal DS1 that is the multi-level signal based on the two or more pull-up control signals PUS1 and PUS2 and the two or more pull-down control signals PDS1 and PDS2. The data I/O pad 29a may output the output data signal DS1.

The semiconductor memory device 202 may include at least one of the first on-die termination (ODT) circuit 297a connected between the power supply voltage VDDQ and a data I/O pad 49a and a second ODT circuit 297b connected between the data I/O pad 49b and the ground voltage VSS. The first ODT circuit 297a may include a first termination resistor RTa and the second ODT circuit 297b may include a second termination resistor RTb.

Based on a configuration of the driver circuit 440 and configurations of the first ODT circuit 297a and the second ODT circuit 297b, a receiver 47a in the semiconductor memory device 202 may receive the multi-level signal according to one of a first kind of interface, a second kind of interface and a third kind of interface. The first kind of interface may correspond to a Low Voltage Swing Terminated Logic (LVSTL) interface, the second kind of interface may correspond to pseudo-open drain interface and the third kind of interface may correspond to a center-tap interface.

When the receiver 47a receives the multi-level signal according to the first kind of interface, each of the first sense amplifier 510 and the second sense amplifier 520 in FIG. 12A may employ the sense amplifier 510 of FIG. 14, corresponding to the first type of sense amplifier and the third sense amplifier 530 in FIG. 12A may employ one of the sense amplifiers 530a, 530b, 530c, 530d and 530e in FIGS. 15 through 19, corresponding to the second type of sense amplifier.

When the receiver 47a receives the multi-level signal according to the second kind of interface or the third kind of interface, the first sense amplifier 510 in FIG. 12A may employ the sense amplifier 510 of FIG. 14, corresponding to the first type of sense amplifier and each of the second sense amplifier 520 and the third sense amplifier 530 in FIG. 12A may employ one of the sense amplifiers 530a, 530b, 530c, 530d and 530e in FIGS. 15 through 19, corresponding to the second type of sense amplifier.

Figure 21A:
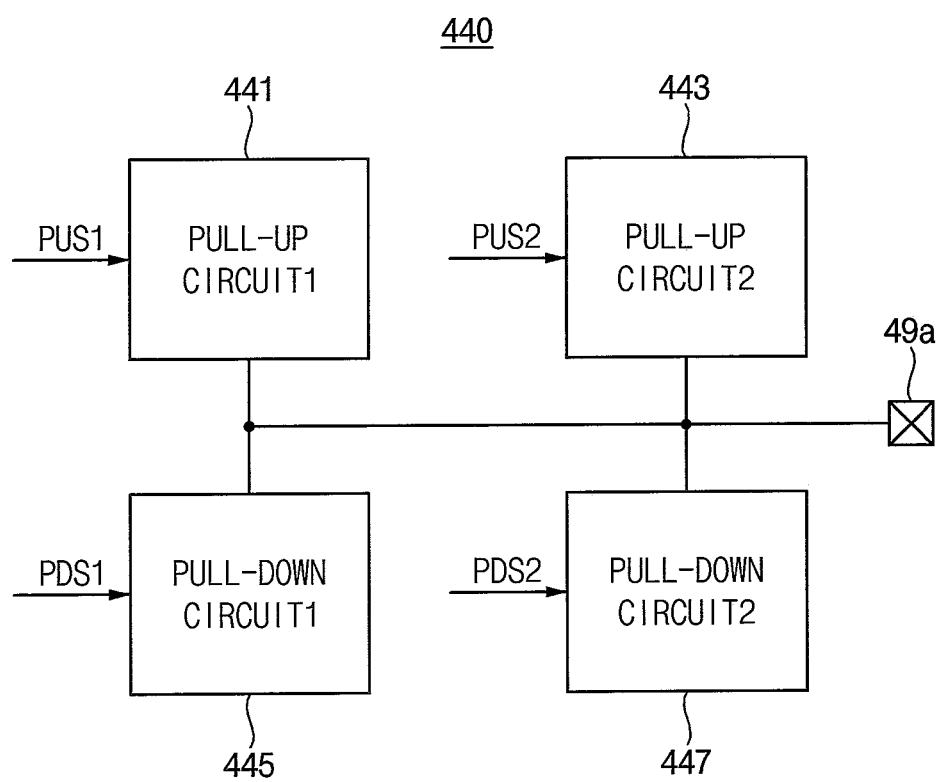
FIGS. 21A, 21B, and 21C are diagrams illustrating examples of a driver circuit included in a transmitter of FIG. 20.
Figure 21B:
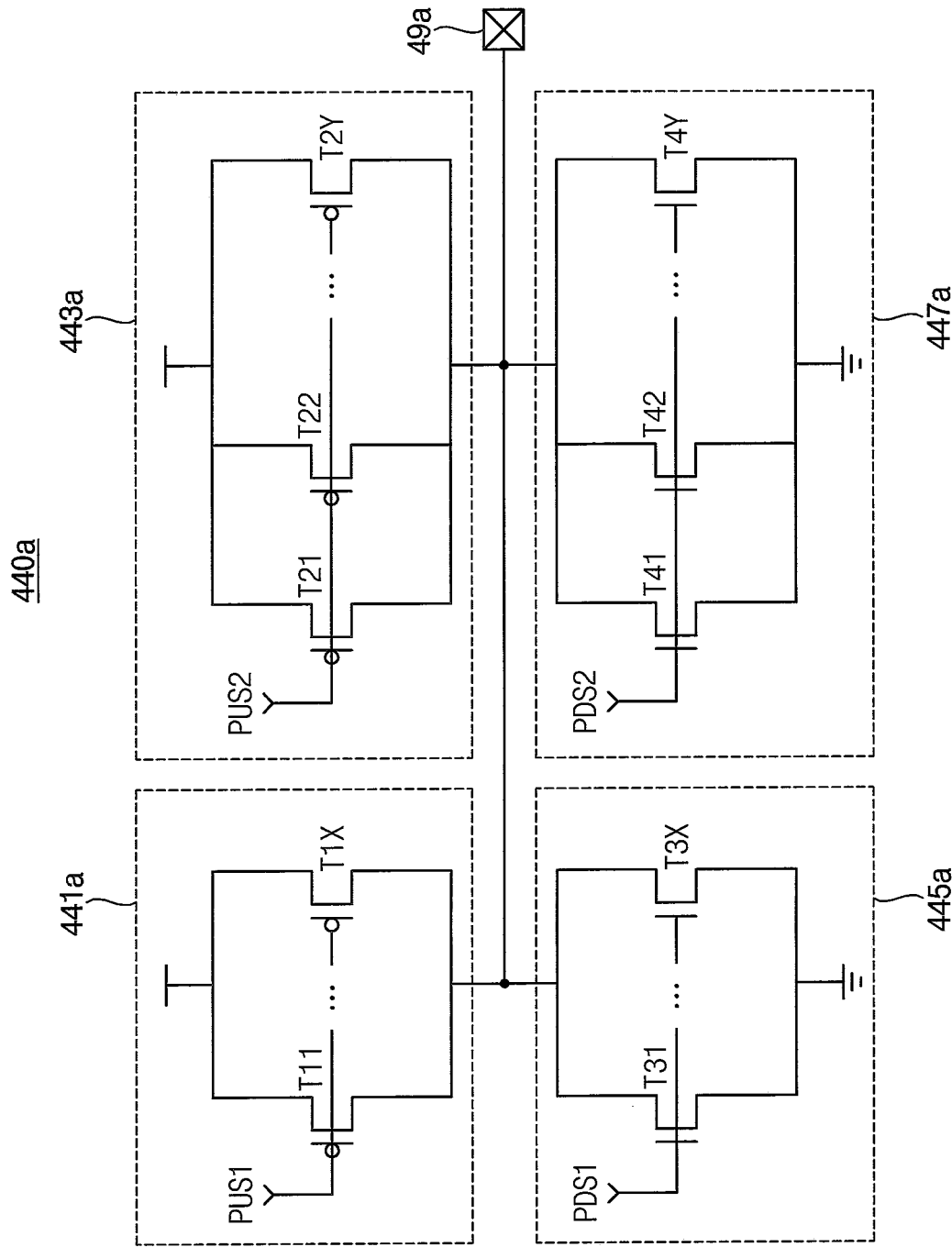
Figure 21C:
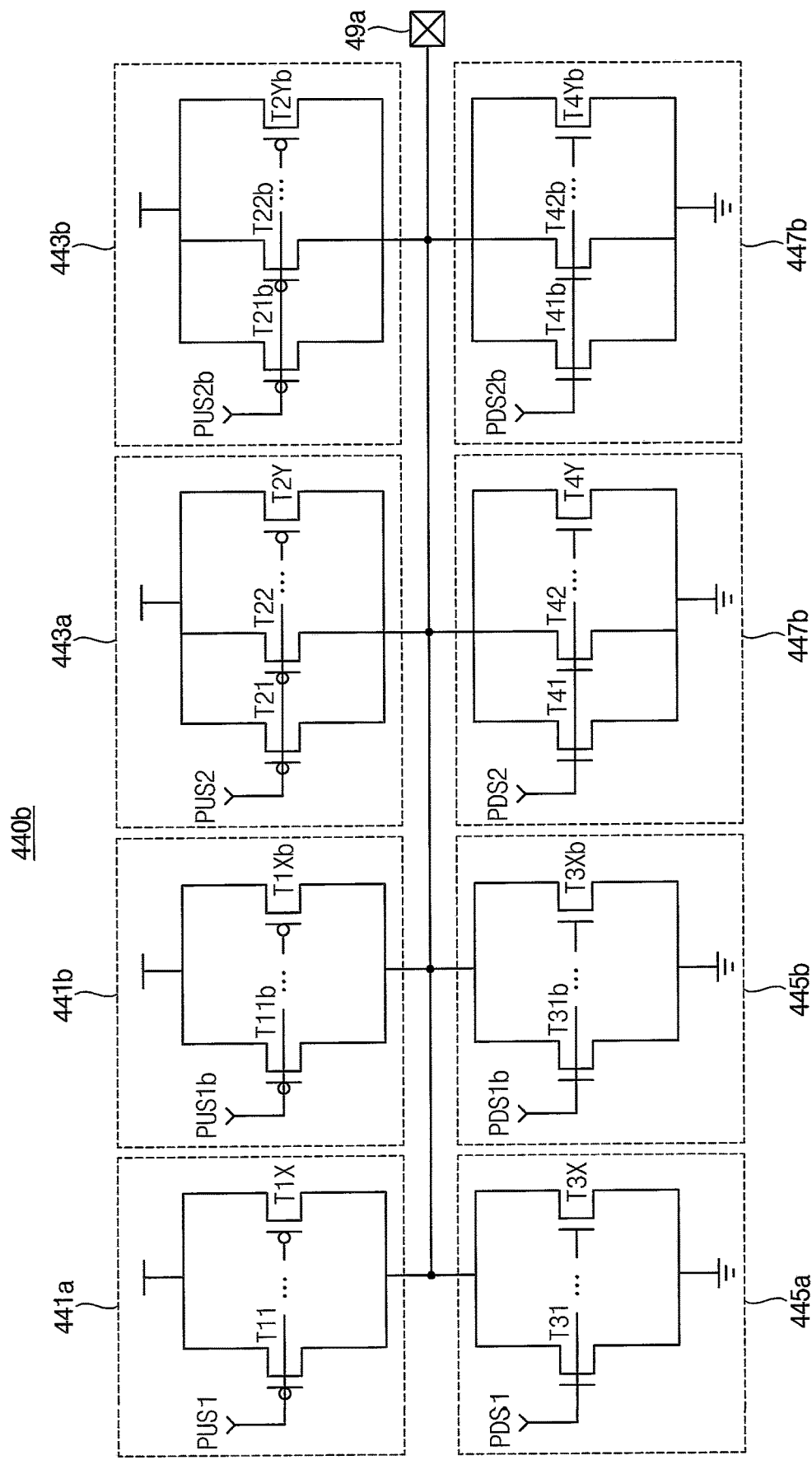

FIGS. 21A, 21B, and 21C are diagrams illustrating examples of a driver circuit 440 included in a transmitter of FIG. 20.

Referring to FIG. 21A, the driver circuit 440 may include a first pull-up circuit 441, a second pull-up circuit 443, a first pull-down circuit 444 and a second pull-down circuit 447.

The first pull-up circuit 441 may pull up the data I/O pad 49a based on the first pull-up control signal PUS1. The second pull-up circuit 443 may pull up the data I/O pad 49a based on the second pull-up control signal PUS2.

The first pull-down circuit 444 may pull down the data I/O pad 49a based on the first pull-down control signal PDS1. The second pull-down circuit 447 may pull down the data I/O pad 49a based on the second pull-down control signal PDS2.

In some example embodiments, as described above, the first pull-up control signal PUS1 and the first voltage setting control signal VSU1 may be the control signals for the LSB, the second pull-up control signal PUS2 and the second voltage setting control signal VSU2 may be the control signals for the MSB, and thus a driving capability of the second pull-up circuit 443 to pull up the data I/O pad 49a may be greater than a driving capability of the first pull-up circuit 441 to pull up the data I/O pad 49a. According to an example embodiment, the driving capability of the second pull-up circuit 443 to pull up the data I/O pad 49a may be approximately twice as large as the driving capability of the first pull-up circuit 441 to pull up the data I/O pad 49a. Similarly, a driving capability of the second pull-down circuit 447 to pull down the data I/O pad 49a may be greater than a driving capability of the first pull-down circuit 444 to pull down the data I/O pad 49a.

Referring to FIG. 21B, a driver circuit 440a may include a first pull-up circuit 441a, a second pull-up circuit 443a, a first pull-down circuit 444a and a second pull-down circuit 447a.

The first pull-up circuit 441a may include a plurality of first pull-up transistors T11, . . . , T1X that are connected in parallel between a power supply voltage and the data I/O pad 49a. The plurality of first pull-up transistors T11, . . . , T1X may be selectively turned on based on the first pull-up control signal PUS1.

The second pull-up circuit 443a may include a plurality of second pull-up transistors T21, T22, . . . , T2Y that are connected in parallel between the power supply voltage and the data I/O pad 49a. The plurality of second pull-up transistors T21, T22, T2Y may be selectively turned on based on the second pull-up control signal PUS2.

When it is required to pull up the output data signal DS1 to the second voltage level VL21, the first pull-up circuit 441a may be enabled or activated by turning on at least some of the plurality of first pull-up transistors T11, . . . , T1X based on the first pull-up control signal PUS1. In this case, the second voltage level VL21 may be adjusted by controlling the number (or quantity) of the plurality of first pull-up transistors T11, . . . , T1X that are turned on. For example, the second voltage level VL21 may increase as the number of the plurality of first pull-up transistors T11, . . . , T1X that are turned on increases. Similarly, when it is required to pull up the output data signal DS1 to the third voltage level VL31, the second pull-up circuit 443a may be enabled based on the second pull-up control signal PUS2, and the third voltage level VL31 may be adjusted by controlling the number of the plurality of second pull-up transistors T21, T22, . . . , T2Y that are turned on. When it is required to pull up the output data signal DS1 to the fourth voltage level VL41, both the first and second pull-up circuits 441a and 443a may be simultaneously enabled based on the first and second pull-up control signals PUS1 and PUS2, and the fourth voltage level VL41 may be adjusted by controlling the number of the plurality of first pull-up transistors T11, . . . , T1X and the plurality of second pull-up transistors T21, T22, . . . , T2Y that are turned on. When at least one of the second, third and fourth voltage levels VL21, VL31 and VL41 are adjusted as described above, the voltage intervals and the voltage swing width may be adjusted.

The first pull-down circuit 444a may include a plurality of first pull-down transistors T31, . . . , T3X that are connected in parallel between the data I/O pad 49a and a ground voltage. The plurality of first pull-down transistors T31, . . . , T3X may be selectively turned on based on the first pull-down control signal PDS1.

The second pull-down circuit 447a may include a plurality of second pull-down transistors T41, T42, . . . , T4Y that are connected in parallel between the data I/O pad 49a and the ground voltage. The plurality of second pull-down transistors T41, T42, . . . , T4Y may be selectively turned on based on the second pull-down control signal PDS2.

Operations of the first and second pull-down circuits 444a and 447a may be similar to the operations of the first and second pull-up circuits 441a and 443a.

In some example embodiments, the transistors T11, T1X, T21, T22 and T2Y may be PMOS transistors, and the transistors T31, T3X, T41, T42 and T4Y may be NMOS transistors. In some example embodiments, the number and/or size of transistors may be changed such that the driving capability of the pull-up circuits 441a and 443a and the driving capability of the pull-down circuits 444a and 444b are different from each other.

Referring to FIG. 21C, a driver circuit 440b may include first pull-up circuits 441a and 441b, second pull-up circuits 443a and 443b, first pull-down circuits 444a and 444b, and second pull-down circuits 447a and 447b. The descriptions repeated with FIG. 21B will be omitted.

As compared with the driver circuit 440a of FIG. 21B, the driver circuit 440b may further include the pull-up circuits 441b and 443b and the pull-down circuits 444b and 447b. The pull-up circuits 441b and 443b and the pull-down circuits 444b and 447b may be similar to the pull-up circuits 441a and 443a and the pull-down circuits 444a and 447a, respectively. The pull-up circuits 441b and 443b may include pull-up transistors T11b, . . . , T1Xb, T21b, T22b, . . . , T2Yb that are selectively turned on based on pull-up control signals PUS1b and PUS2b. The pull-down circuits 444a and 447a may include pull-down transistors T31b, . . . , T3Xb, T41b, T42b, . . . , T4Yb that are selectively turned on based on pull-down control signals PDS1b and PDS2b.

In FIG. 21A, when the pull-up circuits 441 and 443 and the pull-down circuits 444 and 447 include NMOS transistors and the semiconductor memory device 202 in FIG. 20 includes the second ODT circuit 297b, the semiconductor memory device 202 may receive the multi-level signal according to the LVSTL interface. That is, when the second ODT circuit 297b is enabled, the semiconductor memory device 202 may receive the multi-level signal according to the LVSTL interface.

In FIG. 21A, when the pull-up circuits 441 and 443 and the pull-down circuits 444 and 447 include PMOS transistors and the semiconductor memory device 202 in FIG. 20 includes the first ODT circuit 297a, the semiconductor memory device 202 may receive the multi-level signal according to the pseudo-open drain interface. That is, when the first ODT circuit 297a is enabled, the semiconductor memory device 202 may receive the multi-level signal according to the pseudo-open drain interface.

In FIG. 21A, when the pull-up circuits 441 and 443 include PMOS transistors, the pull-down circuits 444 and 447 include NMOS transistors and the semiconductor memory device 202 in FIG. 20 includes the first ODT circuit 297a and the second ODT circuit 297b, the semiconductor memory device 202 may receive the multi-level signal according to the center-tap interface. That is, when the first ODT circuit 297a and the second ODT circuit 297b are enabled, the semiconductor memory device 202 may receive the multi-level signal according to the center-tap interface.

Figure 22:
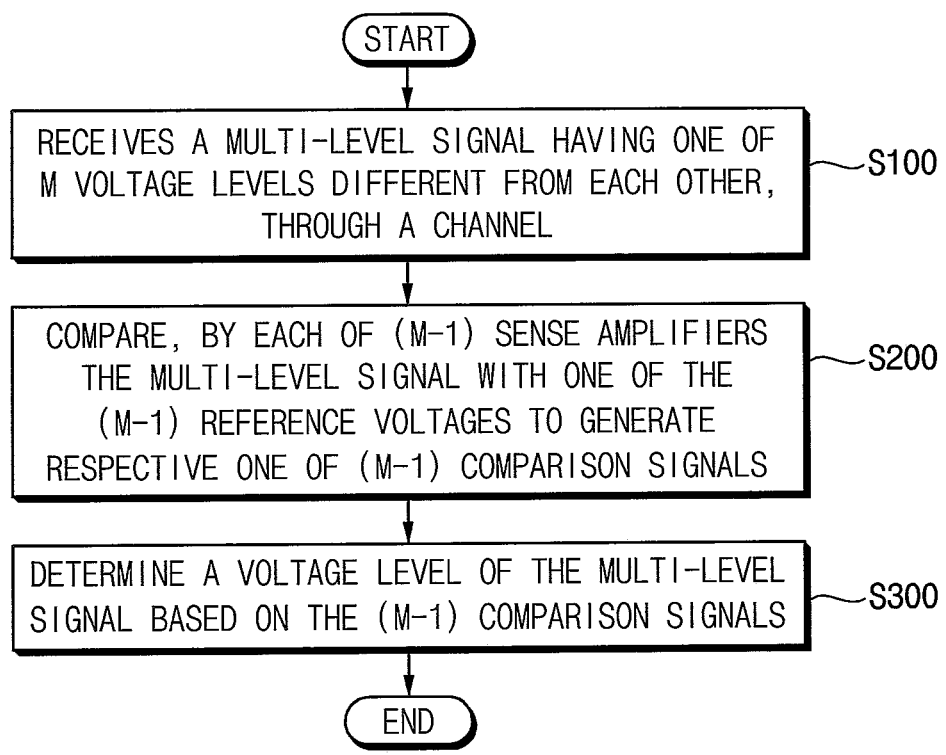
FIG. 22 is a flow chart illustrating a method of receiving a multi-level signal in the semiconductor memory device according to one or more example embodiments.

FIG. 22 is a flow chart illustrating a method of receiving a multi-level signal in the semiconductor memory device according to example embodiments.

Referring to FIGS. 1 through 22, in a method of receiving a multi-level signal in the semiconductor memory device, the multi-level signal receiver 400 in the semiconductor memory device 200 receives the multi-level signal MLDAT having one of M voltage levels different from each other through a channel (operation S100). Here, M is an integer greater than two. Each of the (M−1) sense amplifiers in the multi-level signal receiver 400 compares multi-level signal MLDAT with one of the (M−1) reference voltages to generate respective one of (M−1) comparison signals (operation S200). The output decoder 550 in the multi-level signal receiver 400 decodes the (M−1) comparison signals, determines a voltage level of the multi-level signal MLDAT based on the decoding and outputs the target data signal DQ (operation S300).

Figure 23:
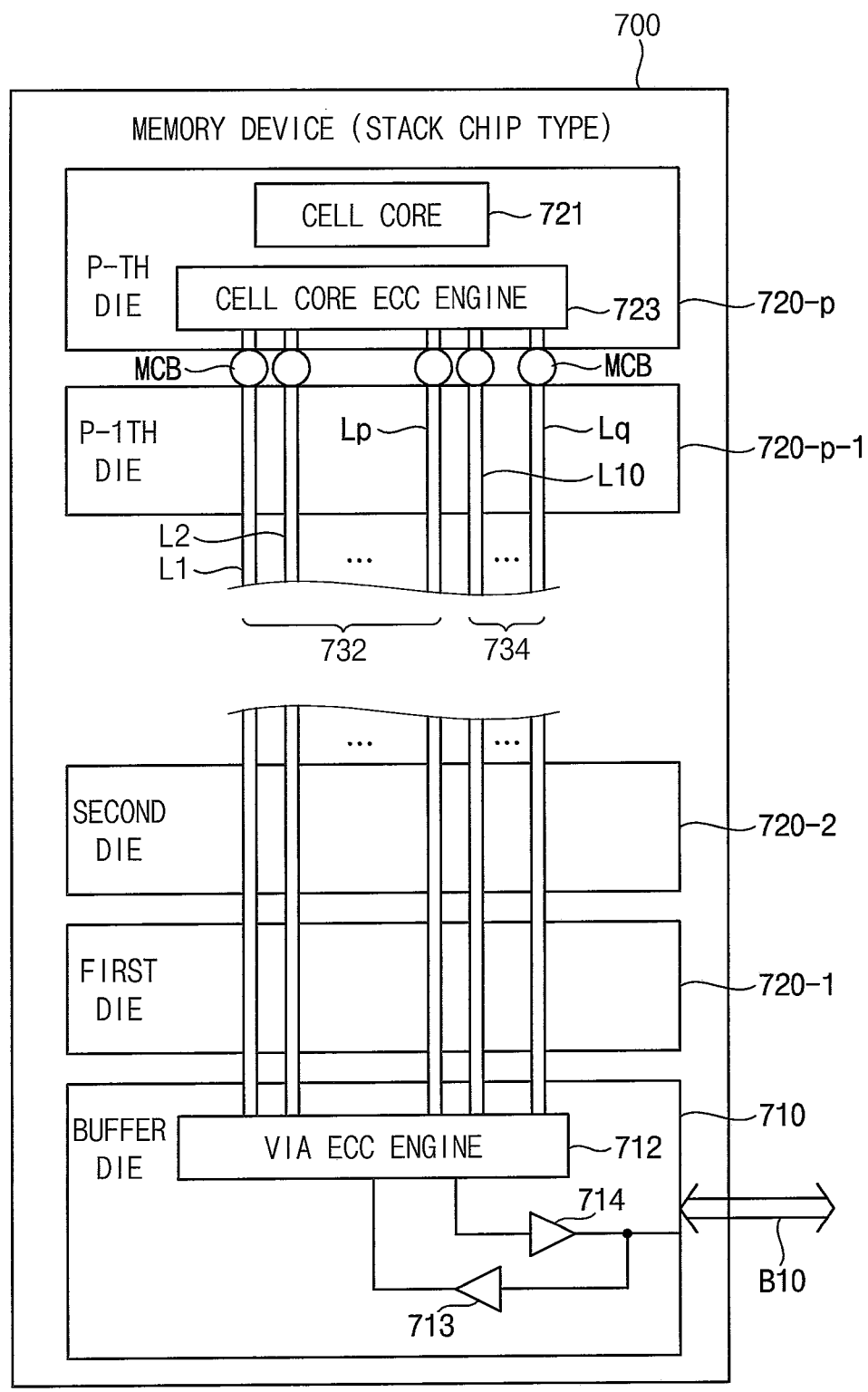
FIG. 23 is a block diagram illustrating a semiconductor memory device according to one or more example embodiments.

FIG. 23 is a block diagram illustrating a semiconductor memory device according to one or more example embodiments.

Referring to FIG. 23, a semiconductor memory device 700 may include at least one buffer die 710 and a plurality of memory dies 720-1 to 720-p (p is a natural number equal to or greater than three) providing a soft error analyzing and correcting function in a stacked chip structure.

The plurality of memory dies 720-1 to 720-p are stacked on the buffer die 710 and conveys data through a plurality of through silicon via (TSV) lines.

At least one of the memory dies 720-1 to 720-p may include a memory core to store data and a cell core ECC engine 722 which generates transmission parity bits (i.e., transmission parity data) based on transmission data to be sent to the at least one buffer die 710. The cell core 721 may include a plurality of memory cells having DRAM cell structure.

The buffer die 711 may include a via ECC engine 712 which corrects a transmission error using the transmission parity bits when a transmission error is detected from the transmission data received through the TSV liens and generates error-corrected data.

The buffer die 711 may further include a receiver 713 and a transmitter 714. The receiver 713 may employ the multi-level signal receiver 500 of FIG. 11. Therefore, the receiver 713 receives a multi-level signal having one of M voltage levels different from each other, and may determine a voltage level of the multi-level signal by using M−1 sense amplifiers. At least two sense amplifiers of the (M−1) sense amplifiers include a first type of sense amplifier and a second type of sense amplifier having different sensing characteristics.

The semiconductor memory device 700 may be a stack chip type memory device or a stacked memory device which conveys data and control signals through the TSV lines. The TSV lines may be also called 'through electrodes'.

The cell core ECC engine 722 may perform error correction on data which is outputted from the memory die 720-*p* before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 732 which is formed at one memory die 720-*p* may include TSV lines L1 to L*p*, and a parity TSV line group 734 may include TSV lines L10 to L*q*.

The TSV lines L1 to L*p* of the data TSV line group 732 and the parity TSV lines L10 to L*q* of the parity TSV line group 734 may be connected to micro bumps MCB which are correspondingly formed among the memory dies 720-1 to 720-*p*.

At least one of the memory dies 720-1 to 720-*p* may include DRAM cells each including at least one access transistor and one storage capacitor.

The semiconductor memory device 700 may have a three-dimensional (3D) chip structure or a 2.5D chip structure to communicate with the host through a data bus B10. The buffer die 710 may be connected with the memory controller through the data bus B10.

The cell core ECC engine 722 may output transmission parity bits as well as the transmission data through the parity TSV line group 734 and the data TSV line group 732 respectively. The outputted transmission data may be data which is error-corrected by the cell core ECC engine 722.

The via ECC engine 712 may determine whether a transmission error occurs at the transmission data received through the data TSV line group 732, based on the transmission parity bits received through the parity TSV line group 734. When a transmission error is detected, the via ECC engine 712 may correct the transmission error on the transmission data using the transmission parity bits. When the transmission error is uncorrectable, the via ECC engine 712 may output information indicating occurrence of an uncorrectable data error.

Figure 24:
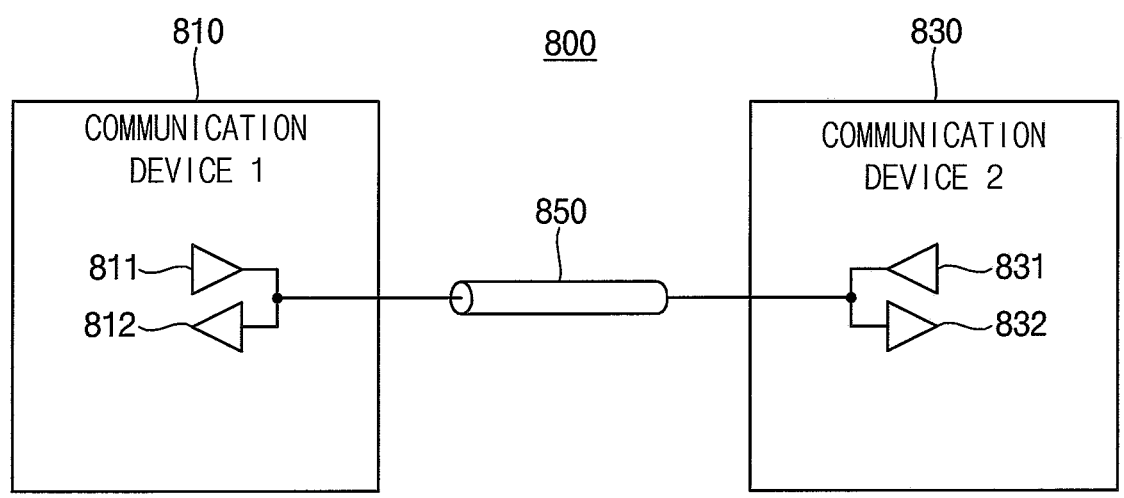
FIG. 24 is a block diagram illustrating a communication system according to one or more example embodiments.

FIG. 24 is a block diagram illustrating a communication system according to one or more example embodiments.

Referring to FIG. 24, a communication system 800 includes a first communication device 810, a second communication device 830 and a channel 850.

The first communication device 810 includes a first transmitter 811 and a first receiver 812. The second communication device 830 includes a second transmitter 831 and a second receiver 832. The first transmitter 811 and the first receiver 812 are connected to the second transmitter 831 and the second receiver 832 through the channel 850. In some example embodiments, each of the first and second communication devices 810 and 830 may include a plurality of transmitters and a plurality of receivers, and the communication system 800 may include a plurality of channels for connecting the plurality of transmitters and a plurality of receivers.

The receivers 812 and 832 may be the multi-level signal receiver according to one or more example embodiments, may receive a multi-level signal having one of M voltage levels different from each other, and may determine a voltage level of the multi-level signal by using M−1 sense amplifiers.

The inventive concept may be applied to various devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A multi-level signal receiver comprising:
a data sampler circuit including (M−1) sense amplifiers configured to compare a multi-level signal with (M−1) reference voltages, the data sampler circuit configured to generate a data signal including N bits, the multi-level signal having one of M voltage levels different from each other, M being an integer greater than two and N being an integer greater than one; and
a reference voltage generator circuit configured to generate the (M−1) reference voltages,
wherein at least two sense amplifiers of the (M−1) sense amplifiers have different sensing characteristics,
wherein a first transistor of a first sense amplifier, among the at least two sense amplifiers, and a second transistor of a second sense amplifier, among the at least two sense amplifiers, have different threshold voltages, and
wherein the first transistor and the second transistor are of a same type, among a p-channel metal-oxide semiconductor (PMOS) type transistor and a n-channel metal-oxide semiconductor (NMOS) type transistor.

2. The multi-level signal receiver of claim 1, wherein:
the M voltage levels include a first voltage level, a second voltage level greater than the first voltage level, a third voltage level greater than the second voltage level and a fourth voltage level greater than the third voltage level;
the (M−1) reference voltages include a first reference voltage, a second reference voltage and a third reference voltage;
the N bits include a first bit and a second bit; and
a level of the second reference voltage is greater than a level of the first reference voltage and a level of the third reference voltage is greater than the level of the second reference voltage.

3. The multi-level signal receiver of claim 2,
wherein the M−1 sense amplifiers includes:
- a first sense amplifier configured to compare the multi-level signal with the first reference voltage to output a first comparison signal based on a clock signal;
- a second sense amplifier configured to compare the multi-level signal with the second reference voltage to output a second comparison signal based on the clock signal; and
- a third sense amplifier configured to compare the multi-level signal with the third reference voltage to output a third comparison signal based on the clock signal, and wherein the data sampler circuit includes:
- a clock generator configured to generate the clock signal; and
- an output decoder configured to decode the first comparison signal, the second comparison signal and the third comparison signal to output the data signal.

4. The multi-level signal receiver of claim 3, wherein:
based on the multi-level signal receiver receiving the multi-level signal through a first kind of interface:
- each of the first sense amplifier and the second sense amplifier includes a first type of sense amplifier having a first sensing characteristic; and
- the third sense amplifier includes a second type of sense amplifier having a second sensing characteristic different from the first sensing characteristic.

5. The multi-level signal receiver of claim 4, wherein the first type of sense amplifier includes:
- a first default p-channel metal-oxide semiconductor (PMOS) transistor connected between a power supply voltage and a first internal node, wherein a gate of the first default PMOS transistor receives the clock signal;
- a second default PMOS transistor connected between the first internal node and a second internal node, wherein a gate of the second default PMOS transistor receives the multi-level signal;
- a third default PMOS transistor connected between the first internal node and a third internal node, wherein a gate of the third default PMOS transistor receives one of the first reference voltage and the second reference voltage;
- a first default transmission gate connected between the second internal node and the third internal node and connected to a ground voltage and the power supply voltage;
- a first default n-channel metal-oxide semiconductor (NMOS) transistor connected between the second internal node and the ground voltage, wherein a gate of the first default NMOS transistor receives the clock signal; and
- a second default NMOS transistor connected between the third internal node and the ground voltage, wherein a gate of the second default NMOS transistor receives the clock signal, wherein the first type of sense amplifier outputs one of the first comparison signal and the second comparison signal at the third internal node.

6. The multi-level signal receiver of claim 5, wherein the second type of sense amplifier includes:
- a first p-channel metal-oxide semiconductor (PMOS) transistor connected between the power supply voltage and a first node, wherein a gate of the first PMOS transistor receives the clock signal;
- a second PMOS transistor connected between the first node and a second node, wherein a gate of the second PMOS transistor receives the multi-level signal;
- a third PMOS transistor connected between the first node and a third node, wherein a gate of the third PMOS transistor receives the third reference voltage;
- a transmission gate connected between the second node and the third node and connected to the ground voltage and the power supply voltage;
- a first n-channel metal-oxide semiconductor (NMOS) transistor connected between the second node and the ground voltage, wherein a gate of the first NMOS transistor receives the clock signal; and
- a second NMOS transistor connected between the third node and the ground voltage, wherein a gate of the second NMOS transistor receives the clock signal, wherein the second type of sense amplifier outputs the third comparison signal at the third node.

7. The multi-level signal receiver of claim 6, wherein:
- a first threshold voltage of each of the second PMOS transistor and the third PMOS transistor is smaller than a second threshold voltage of each of the second default PMOS transistor and the third default PMOS transistor; and
- the first type of sense amplifier and the second type of sense amplifier have the first sensing characteristic and the second sensing characteristic with respect to the third reference voltage and the one of the first reference voltage and the second reference voltage, respectively, based on a difference between the first threshold voltage and the second threshold voltage.

8. The multi-level signal receiver of claim 5, wherein the second type of sense amplifier includes:
- a first p-channel metal-oxide semiconductor (PMOS) transistor connected between the power supply voltage and a first node, wherein a gate of the first PMOS transistor receives the clock signal;
- second and third PMOS transistors connected in parallel between the first node and a second node, wherein a gate of the second PMOS transistor and a gate of the third PMOS transistor receive the multi-level signal;
- fourth and fifth PMOS transistors connected in parallel between the first node and a third node, wherein a gate of the fourth PMOS transistor and a gate of the fifth PMOS transistor receive the third reference voltage;
- a second default transmission gate connected between the second node and the third node and connected to the ground voltage and the power supply voltage;
- a first n-channel metal-oxide semiconductor (NMOS) transistor connected between the second node and the ground voltage, wherein a gate of the first NMOS transistor receives the clock signal; and
- a second NMOS transistor connected between the third node and the ground voltage, wherein a gate of the second NMOS transistor receives the clock signal, wherein the second type of sense amplifier outputs the third comparison signal at the third node.

9. The multi-level signal receiver of claim 8, wherein:
- a first threshold voltage of each the second through fifth PMOS transistors is smaller than a second threshold voltage of each the second default PMOS transistor and the third default PMOS transistor; and
- the first type of sense amplifier and the second type of sense amplifier have the first sensing characteristic and the second sensing characteristic with respect to the third reference voltage and the one of the first reference voltage and the second reference voltage, respectively, based on a difference between the first threshold voltage and the second threshold voltage.

10. The multi-level signal receiver of claim 5, wherein the second type of sense amplifier includes:
a first p-channel metal-oxide semiconductor (PMOS) transistor connected between the power supply voltage and a first node, wherein a gate of the first PMOS transistor receives the clock signal;
a second PMOS transistor which has a source coupled to the first node, a drain coupled to a second node, a body coupled to the source and a gate which receives the multi-level signal;
a third PMOS transistor which has a source coupled to the first node, a drain coupled to a third node, a body coupled to the source and a gate which receives the one of the first reference voltage and the second reference voltage;
a transmission gate connected between the second node and the third node and connected to the ground voltage and the power supply voltage;
a first n-channel metal-oxide semiconductor (NMOS) transistor connected between the second node and the ground voltage, wherein a gate of the first NMOS transistor receives the clock signal; and
a second NMOS transistor connected between the third node and the ground voltage, wherein a gate of the second NMOS transistor receives the clock signal,
wherein the second type of sense amplifier outputs the third comparison signal at the third node, and
a first threshold voltage of each of the second PMOS transistor and the third PMOS transistor is smaller than a second threshold voltage of each of the second default PMOS transistor and the third default PMOS transistor.

11. The multi-level signal receiver of claim 5, wherein the second type of sense amplifier includes:
a first p-channel metal-oxide semiconductor (PMOS) transistor connected between the power supply voltage and a first node, wherein a gate of the first PMOS transistor receives the clock signal;
a second PMOS transistor which has a source coupled to the first node, a drain coupled to a second node, a body coupled to a bias voltage and a gate receiving the multi-level signal;
a third PMOS transistor which has a source coupled to the first node, a drain coupled to a third node, a body coupled to the bias voltage and a gate receiving the one of the first reference voltage and the second reference voltage;
a transmission gate which is connected between the second node and the third node and is connected to the ground voltage and the power supply voltage;
a first n-channel metal-oxide semiconductor (NMOS) transistor connected between the second node and the ground voltage, wherein a gate of the first NMOS transistor receives the clock signal; and
a second NMOS transistor connected between the third node and the ground voltage and has a gate receiving the clock signal,
wherein the second type of sense amplifier outputs the third comparison signal at the third node, and
a first threshold voltage of each of the second PMOS transistor and the third PMOS transistor is smaller than as second threshold voltage of each of the second default PMOS transistor and the third default PMOS transistor.

12. The multi-level signal receiver of claim 5, wherein the second type of sense amplifier includes:
a first p-channel metal-oxide semiconductor (PMOS) transistor connected between the power supply voltage and a first node, wherein a gate of the first PMOS transistor receives the clock signal;
a second PMOS transistor connected between the first node and a second node, wherein a gate of the second PMOS transistor receives the clock signal;
a transmission gate connected between the second node and a third node and connected to the ground voltage and the power supply voltage;
a first n-channel metal-oxide semiconductor (NMOS) transistor connected between the second node and a fourth node, wherein a gate of the first NMOS transistor receives the multi-level signal;
a second NMOS transistor connected between the third node and the fourth node, wherein a gate of the second NMOS transistor receives the third reference voltage; and
a third NMOS transistor connected between the fourth node and the ground voltage, wherein a gate of the third NMOS transistor receives the clock signal,
wherein the second type of sense amplifier outputs the third comparison signal at the second node, and
wherein:
a first threshold voltage of each of the second NMOS transistor and the third NMOS transistor is different from a second threshold voltage of each of the second default NMOS transistor and the third default NMOS transistor, and
the first type of sense amplifier and the second type of sense amplifier have the first sensing characteristic and the second sensing characteristic with respect to the third reference voltage and the one of the first reference voltage and the second reference voltage, respectively, based on a difference of the first threshold voltage and the second threshold voltage.

13. The multi-level signal receiver of claim 3, wherein:
based on the multi-level signal receiver receives the multi-level signal through a second kind of interface different from a first kind of interface:
the first sense amplifier includes a first type of sense amplifier having a first sensing characteristic, and
each of the second sense amplifier and the third sense amplifier includes a second type of sense amplifier having a second sensing characteristic different from the first sensing characteristic.

14. The multi-level signal receiver of claim 13, wherein the first type of sense amplifier includes:
a first default p-channel metal-oxide semiconductor (PMOS) transistor connected between a power supply voltage and a first internal node, wherein a gate of the first default PMOS transistor receives the clock signal;
a second default PMOS transistor connected between the first internal node and a second internal node, wherein a gate of the second PMOS transistor receives the multi-level signal;
a third default PMOS transistor connected between the first internal node and a third internal node, wherein a gate of the third default PMOS transistor receives one of the first reference voltage and the second reference voltage;
a default transmission gate connected between the second internal node and the third internal node and connected to a ground voltage and the power supply voltage;
a first default n-channel metal-oxide semiconductor (NMOS) transistor connected between the second internal node and the ground voltage, wherein a gate of the first default NMOS transistor receives the clock signal; and a second default NMOS transistor connected between the third internal node and the ground voltage, wherein a gate of the second default NMOS transistor receives the clock signal, wherein the first type of sense amplifier outputs one of the first comparison signal and the second comparison signal at the third internal node.

15. The multi-level signal receiver of claim 14, wherein the second type of sense amplifier includes:

a first p-channel metal-oxide semiconductor (PMOS) transistor connected between the power supply voltage and a first node, wherein a gate of the first PMOS transistor receives the clock signal;

a second PMOS transistor connected between the first node and a second node, wherein a gate of the second PMOS transistor receives the multi-level signal;

a third PMOS transistor connected between the first node and a third node, wherein a gate of the third PMOS transistor receives the third reference voltage;

a transmission gate connected between the second node and the third node and connected to the ground voltage and the power supply voltage;

a first n-channel metal-oxide semiconductor (NMOS) transistor connected between the second node and the ground voltage, wherein a gate of the first NMOS transistor receives the clock signal; and a second NMOS transistor connected between the third node and the ground voltage, wherein a gate of the second NMOS transistor receives the clock signal, and wherein the second type of sense amplifier outputs the third comparison signal at the third node, and wherein:

a first threshold voltage of each of the second PMOS transistor and the third PMOS transistor is smaller than a second threshold voltage of each of the second default PMOS transistor and the third default PMOS transistor, and the first type of sense amplifier and the second type of sense amplifier have the first sensing characteristic and the second sensing characteristic with respect to the third reference voltage and the one of the first reference voltage and the second reference voltage, respectively, based on a difference between the first threshold voltage and the second threshold voltage.

16. The multi-level signal receiver of claim 3, wherein: based on the first comparison signal, the second comparison signal and the third comparison signal, the output decoder is configured to:

output the data signal corresponding to '11' when the multi-level signal is greater than the third reference voltage;

output the data signal corresponding to '10' when the multi-level signal is smaller than the third reference voltage and greater than the second reference voltage;

output the data signal corresponding to '01' when the multi-level signal is smaller than the second reference voltage and greater than the first reference voltage; and output the data signal corresponding to '00' when the multi-level signal is smaller than the first reference voltage.

17. A memory system comprising:

a memory controller configured to generate a multi-level signal based on input data, the multi-level signal having one of M voltage levels different from each other, M being an integer greater than two; and a memory device configured to receive the multi-level signal from the memory controller and compare the multi-level signal with (M−1) reference voltages to generate a data signal including N bits, N being an integer greater than one, wherein the memory device comprises:

a data sampler circuit including (M−1) sense amplifiers configured to compare the multi-level signal with the (M−1) reference voltages to generate the data signal; and a reference voltage generator circuit configured to generate the (M−1) reference voltages, wherein at least two sense amplifiers of the (M−1) sense amplifiers have different sensing characteristic, and wherein a first transistor of a first sense amplifier, among the at least two sense amplifiers, and a second transistor of a second sense amplifier, among the at least two sense amplifiers, have different threshold voltages, wherein the first transistor and the second transistor are of a same type, among a p-channel metal-oxide semiconductor (PMOS) type transistor and a n-channel metal-oxide semiconductor (NMOS) type transistor.

18. The memory system of claim 17, wherein the memory device further comprises a memory cell array including a plurality of memory cells coupled to a plurality of word-lines and a plurality of bit-lines, the memory cell array configured to store the data signal, and wherein each of the plurality of memory cells has a dynamic random access memory (DRAM) cell configuration.

19. The memory system of claim 17, wherein the memory device further comprises a memory cell array including a plurality of nonvolatile memory cells coupled to a plurality of word-lines and a plurality of bit-lines, the memory cell array configured to store the data signal.

20. An apparatus comprising:

(M−1) sense amplifiers configured to compare a multi-level signal with (M−1) reference voltages and output one or more sense signals; and an output decoder configured to generate an output data signal based on the one or more sense signals, the output data signal including N bits, wherein the multi-level signal having one of M voltage levels different from each other, M being an integer greater than two and N being an integer greater than one, wherein the (M−1) sense amplifiers comprises:

a first sense amplifier including a first transistor having a first voltage threshold; and a second sense amplifier including a second transistor having a second voltage threshold different from the first voltage threshold, wherein the first voltage threshold and the second voltage threshold correspond to voltage thresholds for turning on the first transistor and the second transistor, respectively, and wherein the first transistor and the second transistor are of a same type, among a p-channel metal-oxide semiconductor (PMOS) type transistor and a n-channel metal-oxide semiconductor (NMOS) type transistor.

* * * * *